US012796183B2

(12) United States Patent
Ko et al.

(10) Patent No.: US 12,796,183 B2
(45) Date of Patent: Nov. 10, 2026

(54) LIGHT SOURCE MODULE

(71) Applicant: SEOUL SEMICONDUCTOR CO., LTD., Ansan-si (KR)

(72) Inventors: Miso Ko, Ansan-si (KR); Hee Jeong Ban, Ansan-si (KR); Eunmi Choi, Ansan-si (KR)

(73) Assignee: SEOUL SEMICONDUCTOR CO., LTD., Ansan-si (KR)

( * ) Notice: Subject to any disclaimer, the term of this patent is extended or adjusted under 35 U.S.C. 154(b) by 451 days.

(21) Appl. No.: 18/504,699

(22) Filed: Nov. 8, 2023

(65) Prior Publication Data

US 2024/0162393 A1 May 16, 2024

Related U.S. Application Data

(60) Provisional application No. 63/532,139, filed on Aug. 11, 2023, provisional application No. 63/424,649, filed on Nov. 11, 2022.

(51) Int. Cl.
*H10H 20/858* (2025.01)
*H10H 20/851* (2025.01)

(52) U.S. Cl.
CPC .... *H10H 20/8514* (2025.01); *H10H 20/8512* (2025.01); *H10H 20/858* (2025.01); *H10H 20/8582* (2025.01)

(58) Field of Classification Search
CPC ............... H10H 20/85; H10H 20/8502; H10H 20/8508; H10H 20/857; H10H 20/858;
(Continued)

(56) References Cited

U.S. PATENT DOCUMENTS 6,964,877 B2 * 11/2005 Chen .................. H10H 20/8506 438/106
7,842,526 B2 * 11/2010 Hadame ............... H10H 20/853 257/E33.068

(Continued)

FOREIGN PATENT DOCUMENTS

KR 20140100115 A 8/2014
KR 20170003229 A 1/2017

(Continued)

OTHER PUBLICATIONS

European Search Report from related corresponding European Patent Application No. 25203139.8, dated Feb. 20, 2026.

(Continued)

*Primary Examiner* — Eduardo A Rodela
(74) *Attorney, Agent, or Firm* — Ashurst Perkins Coie US LLP

(57) ABSTRACT

A light source module according to the present invention includes a light emitting diode package, which includes a substrate, a first upper electrode and a second upper electrode disposed on an upper surface of the substrate, a light emitting structure disposed on an upper surface of the first upper electrode and electrically connected to the first and second upper electrodes, and a wavelength conversion portion disposed corresponding to a light emitting region on an upper surface of the light emitting structure, a first lower electrode and a second lower electrode disposed on a lower surface of the substrate and electrically connected to the first and second upper electrodes, respectively, and a heat dissipation pad disposed on a lower surface of the substrate to be spaced apart from the first and second lower electrodes.

19 Claims, 22 Drawing Sheets

(58) Field of Classification Search
CPC ........... H10H 20/8582; H10H 20/8585; H10H 29/036; H10H 29/0361; H10H 29/0365; H10H 29/85; H10H 29/8508; H10H 29/858; H10H 29/8582; H10H 20/8512
See application file for complete search history.

(56) References Cited

U.S. PATENT DOCUMENTS

| | | | | |
|---|---|---|---|---|
| 8,049,330 | B2 * | 11/2011 | Tain | H10H 20/857 257/E23.101 |
| 8,482,016 | B2 * | 7/2013 | Harada | H10H 20/854 257/88 |
| 9,954,150 | B2 * | 4/2018 | Schwarz | H10H 20/853 |
| 10,439,111 | B2 * | 10/2019 | Hung | H10H 20/8514 |
| 10,497,681 | B2 * | 12/2019 | Hung | H10W 90/00 |
| 2007/0235739 | A1 * | 10/2007 | Sun | H10H 20/8582 257/79 |
| 2009/0108281 | A1 | 4/2009 | Yuan et al. | |
| 2010/0072502 | A1 * | 3/2010 | Kadotani | H10H 20/8582 257/E33.056 |
| 2012/0223351 | A1 * | 9/2012 | Margalit | H10H 20/852 257/98 |
| 2014/0131734 | A1 | 5/2014 | Ting | |
| 2015/0325757 | A1 * | 11/2015 | Shuhei | H10H 20/8514 257/98 |
| 2018/0053886 | A1 | 2/2018 | Goto et al. | |
| 2020/0119228 | A1 | 4/2020 | Off et al. | |
| 2020/0152836 | A1 | 5/2020 | Lai et al. | |
| 2021/0193892 | A1 * | 6/2021 | Huang | H10H 20/857 |
| 2022/0209088 | A1 * | 6/2022 | Jeong | H10H 20/8583 |

FOREIGN PATENT DOCUMENTS

| | | | |
|---|---|---|---|
| KR | 20180054327 | A | 5/2018 |
| WO | 2016126053 | A1 | 8/2016 |
| WO | 2019225128 | A1 | 11/2019 |

OTHER PUBLICATIONS

Report that issued in related Patent Application No. PCT/KR2023/018071, dated Feb. 26, 2024.
Extended European Search Report from related corresponding European Patent Application No. 25203139.8, dated May 12, 2026.
Examination Report from corresponding related Indian Patent Application No. 202517047007, dated Apr. 1, 2026.

* cited by examiner

【FIG. 1】
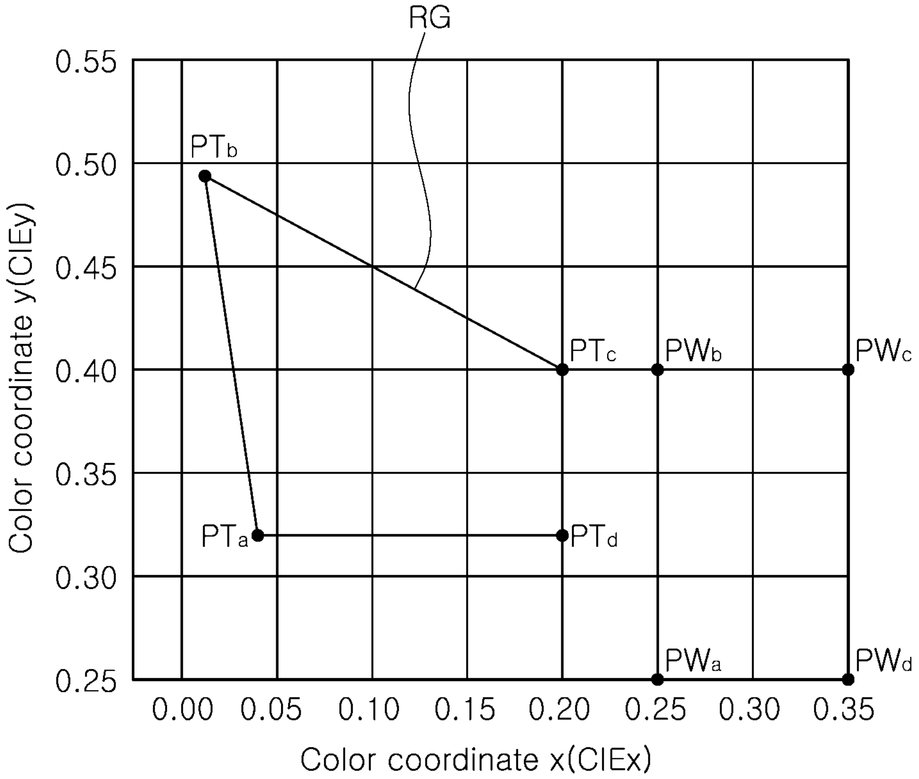

【FIG. 2A】
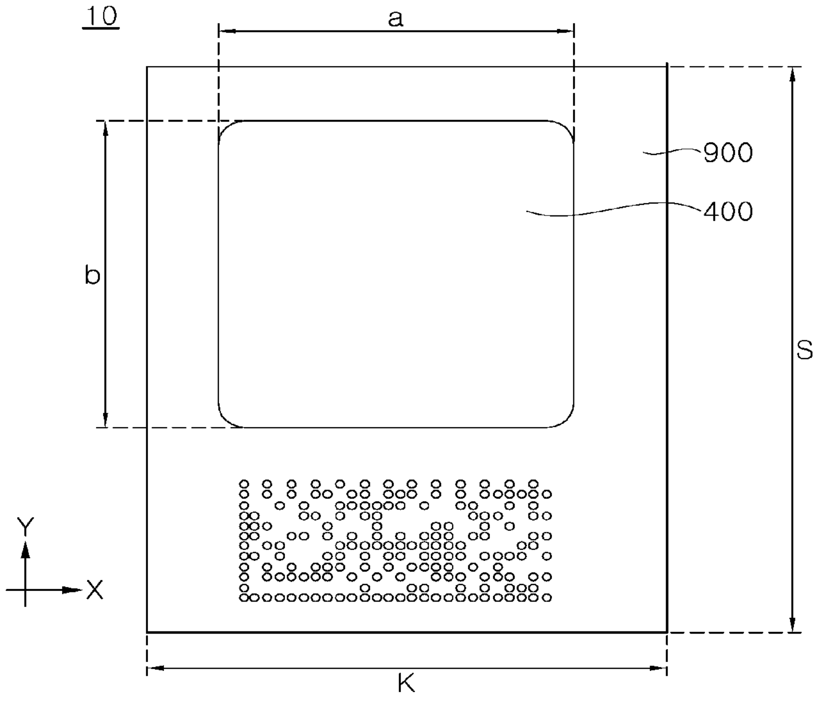
【FIG. 2B】
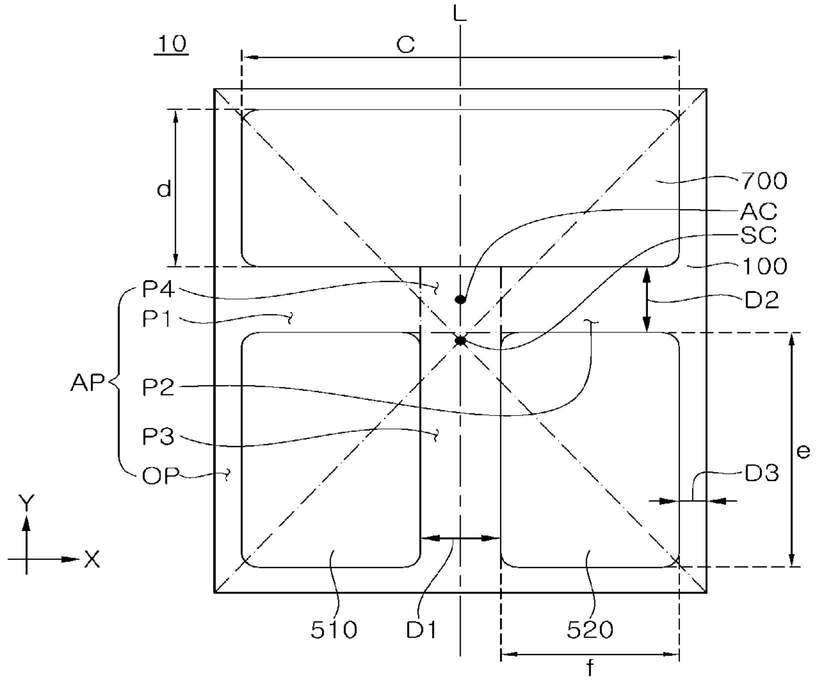

【FIG. 2C】
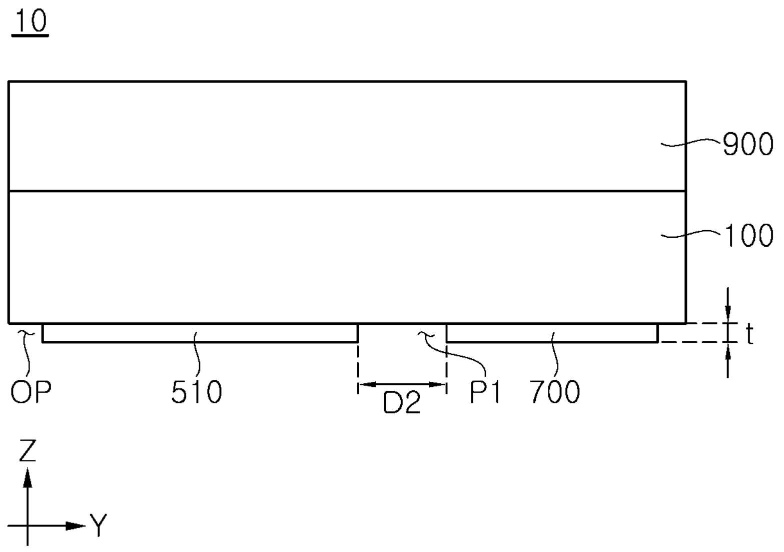
【FIG. 2D】
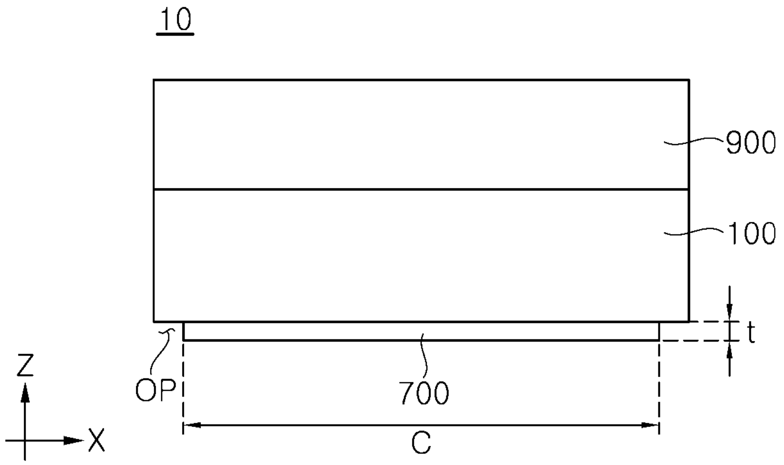

【FIG. 2E】
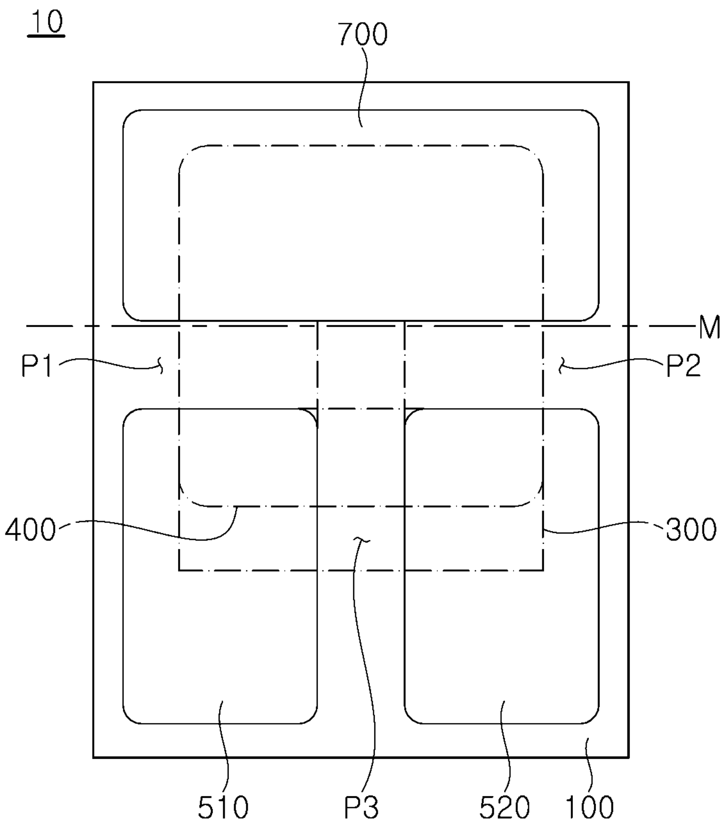

【FIG. 3】
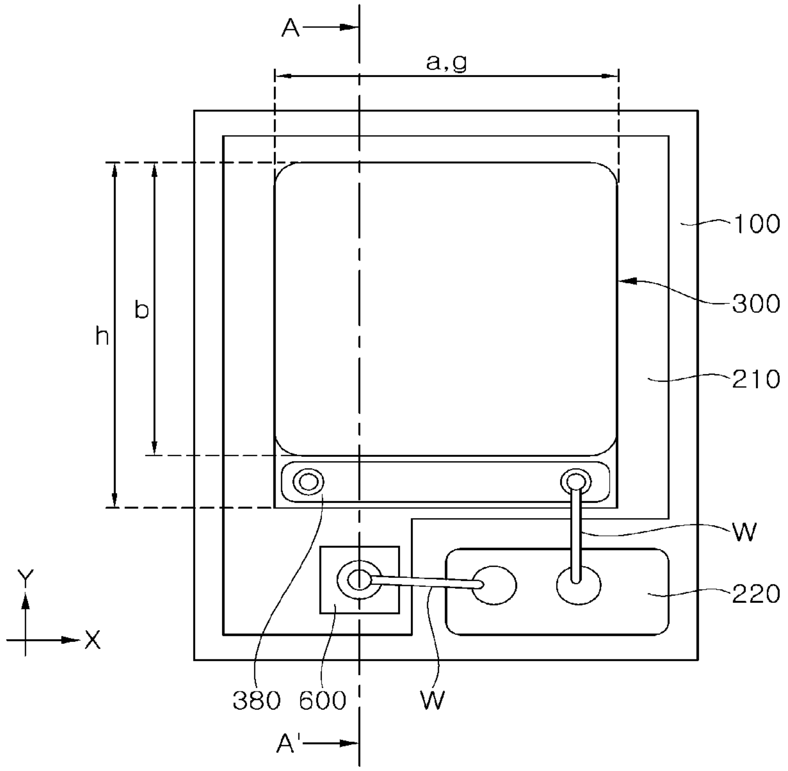
【FIG. 4】
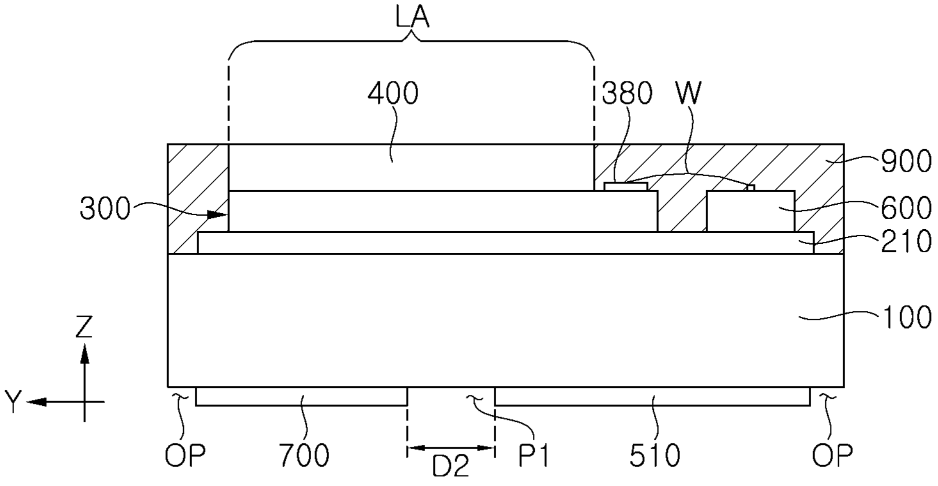

【FIG. 5】
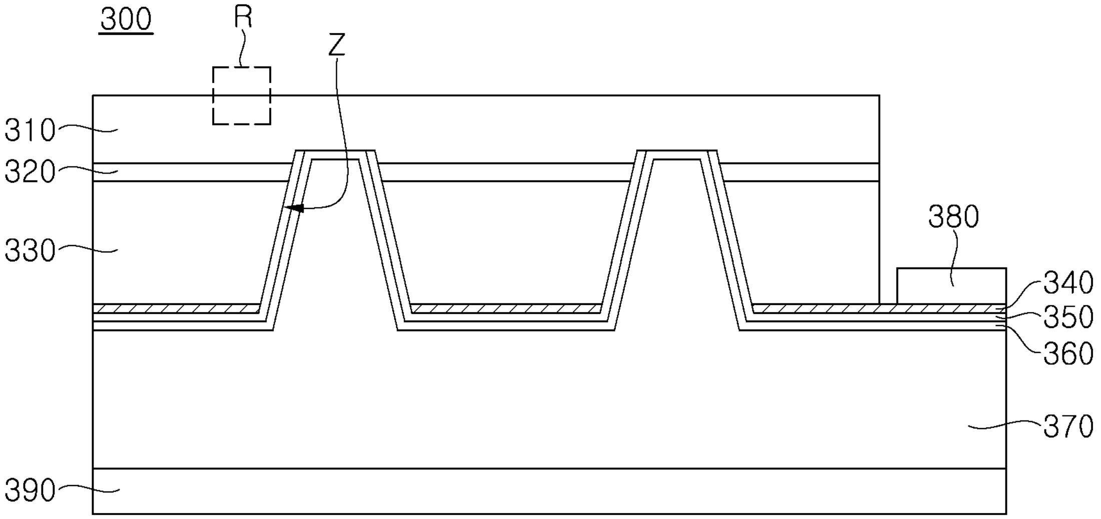

【FIG. 6】
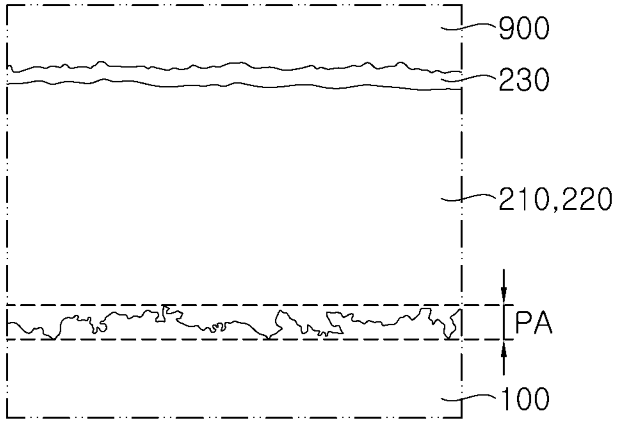
【FIG. 7】
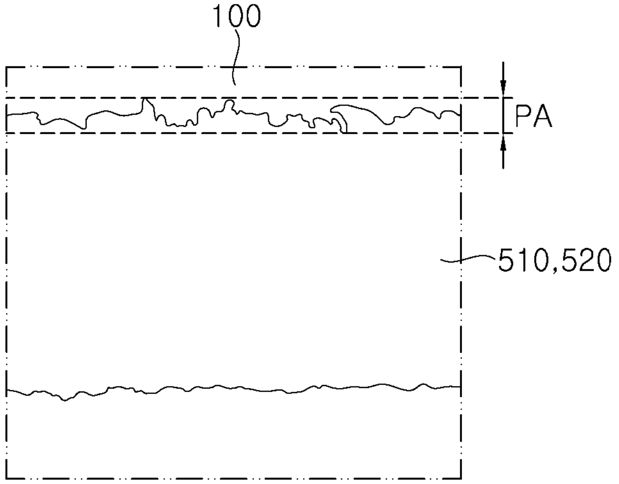

【FIG. 8】
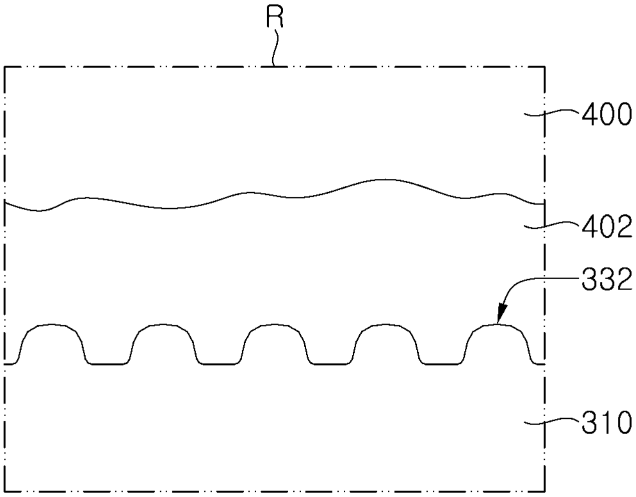
【FIG. 9】
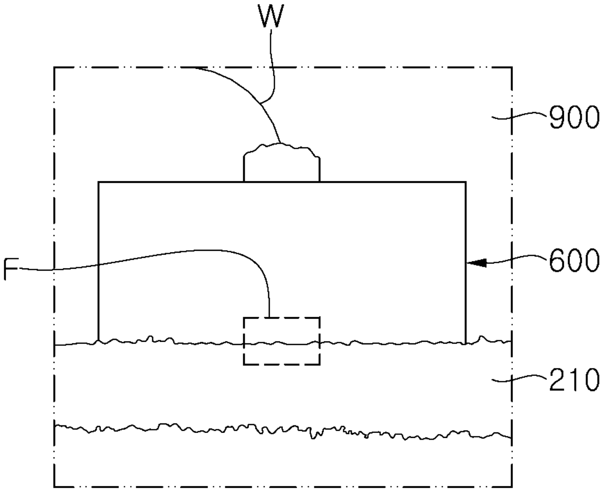

【FIG. 10】
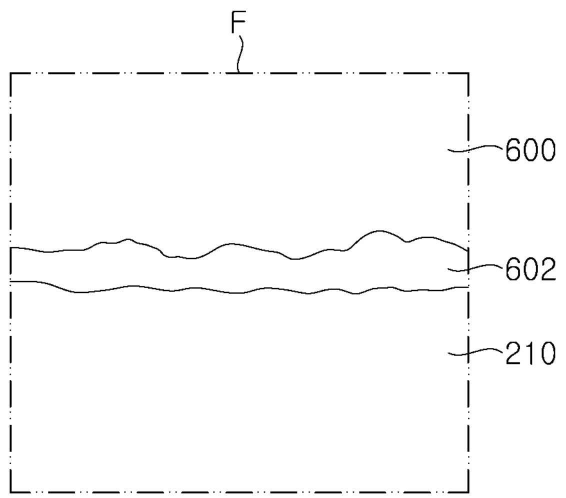
【FIG. 11】
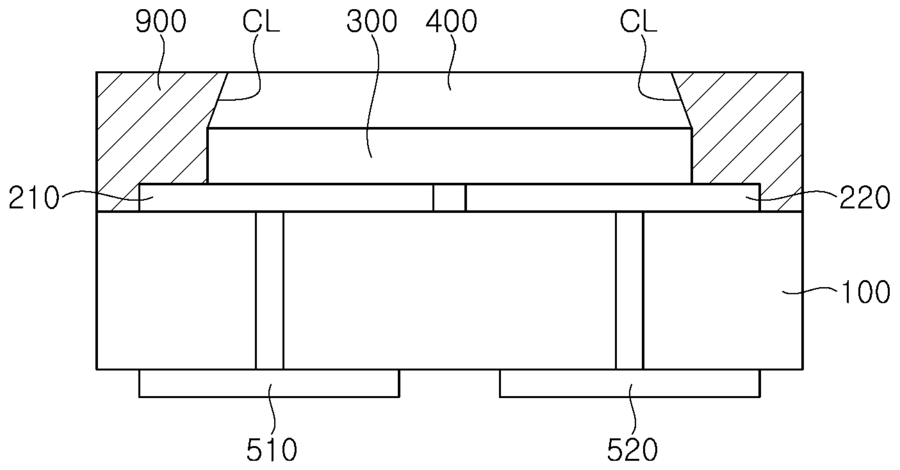

【FIG. 13】
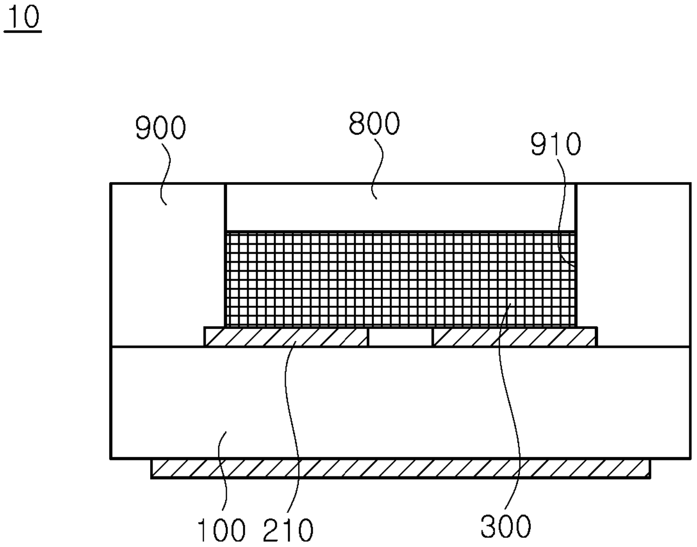
【FIG. 14】
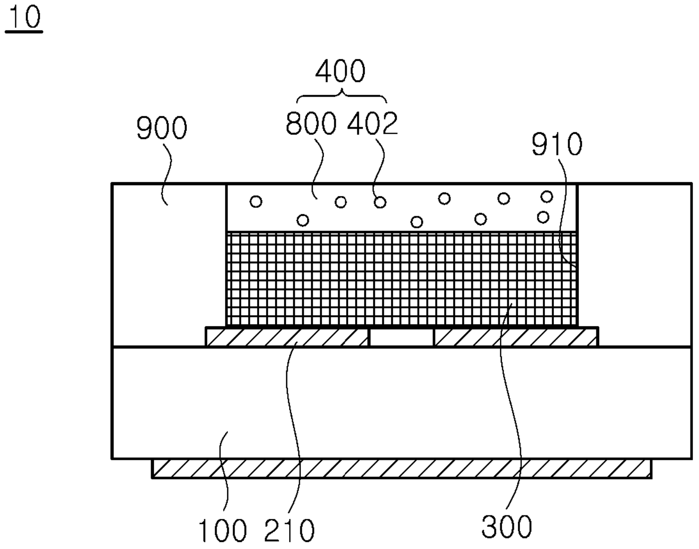

【FIG. 15】
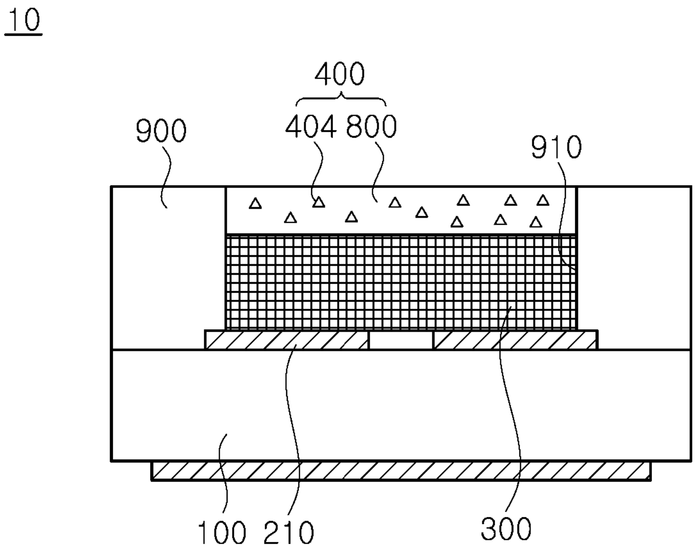

【FIG. 16】
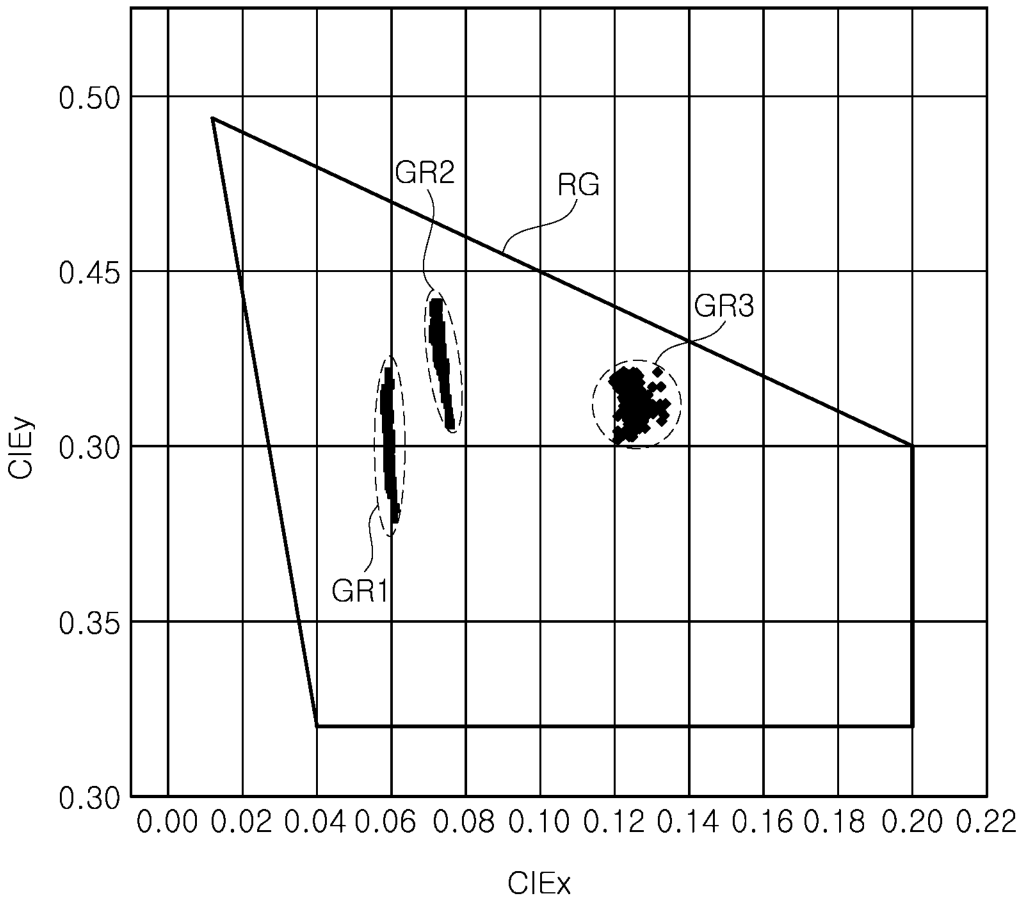

【FIG. 17】
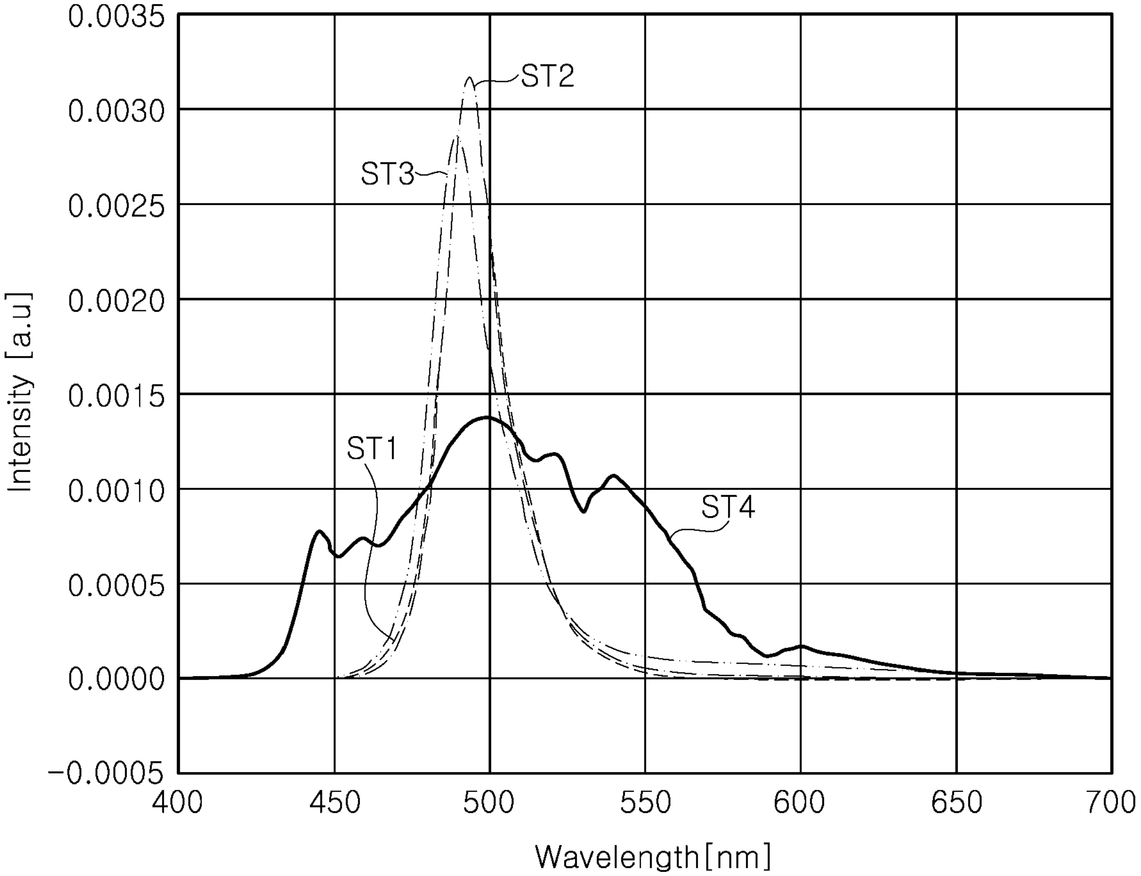

【FIG. 18】
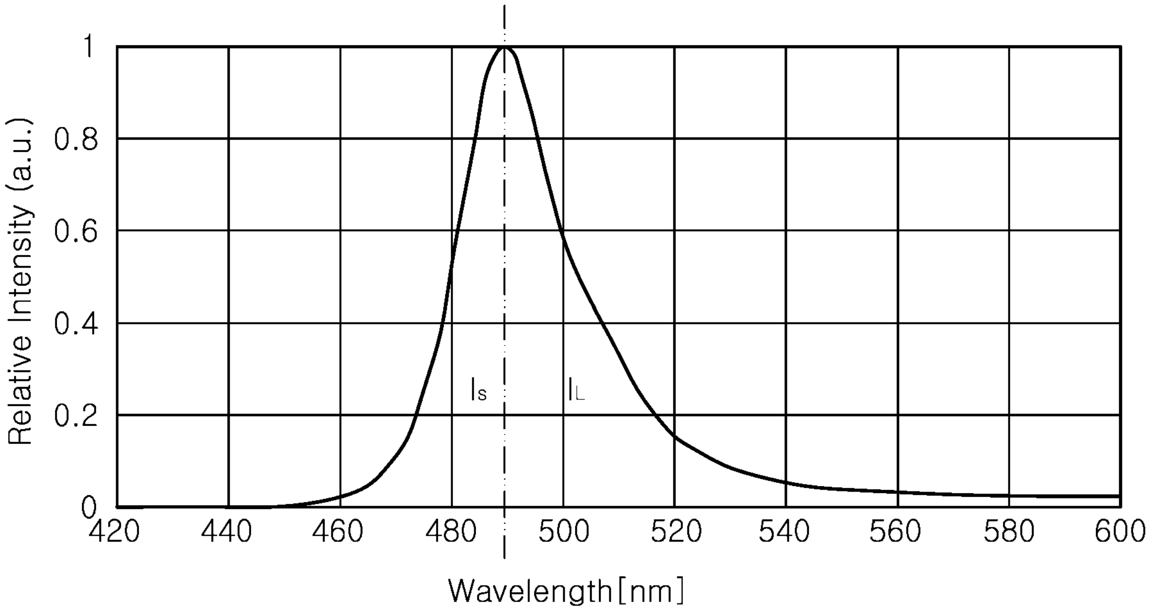
【FIG. 19】
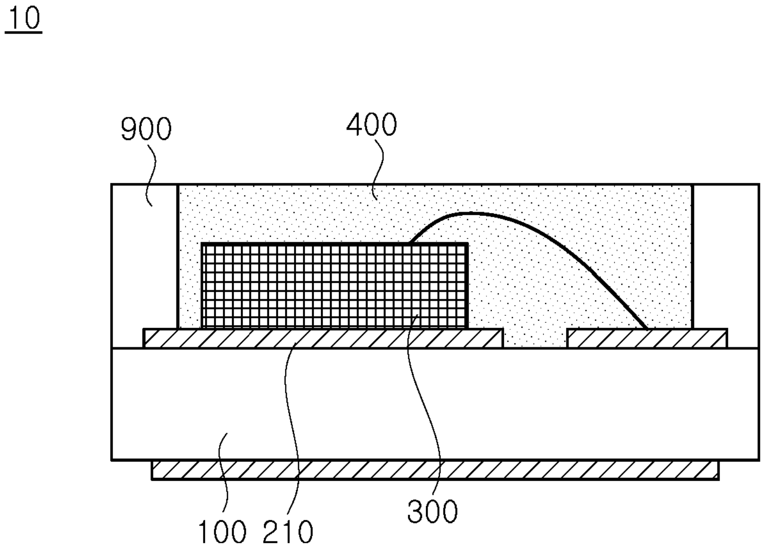

【FIG. 20】
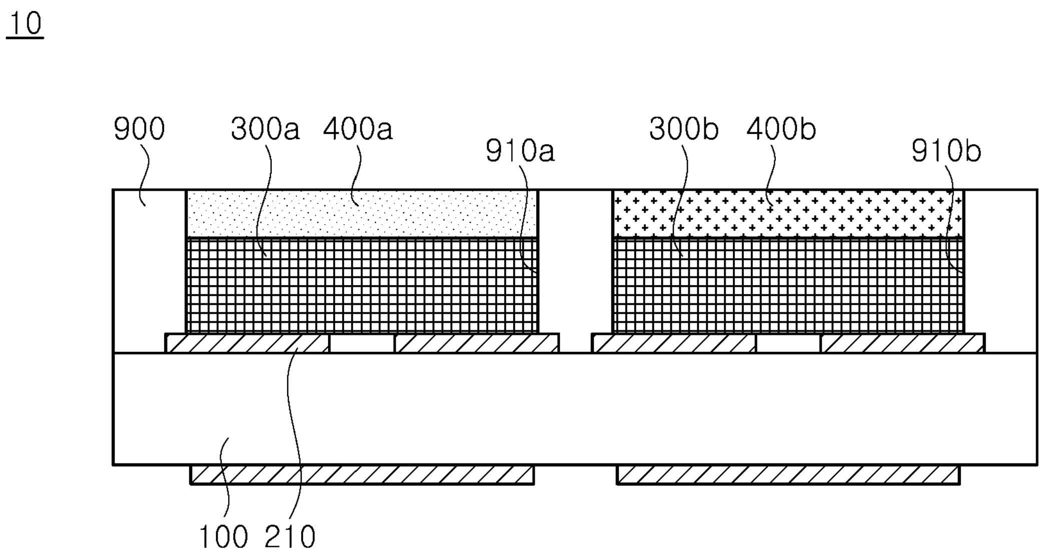
【FIG. 21】
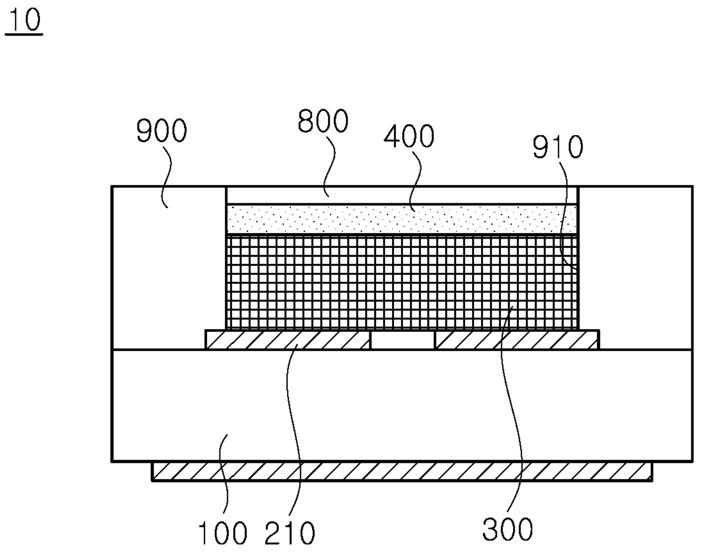

【FIG. 22】
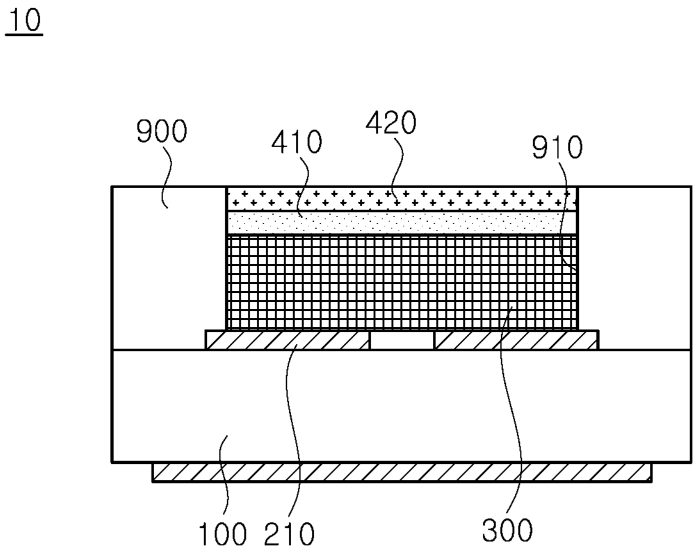
【FIG. 23】
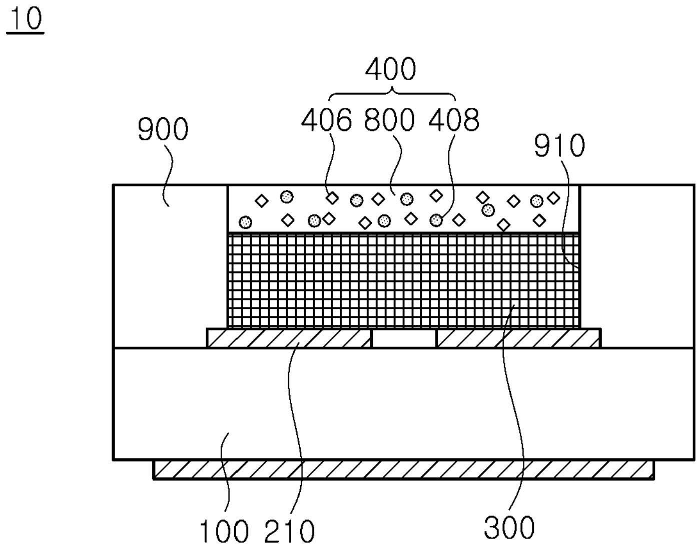

【FIG. 24】
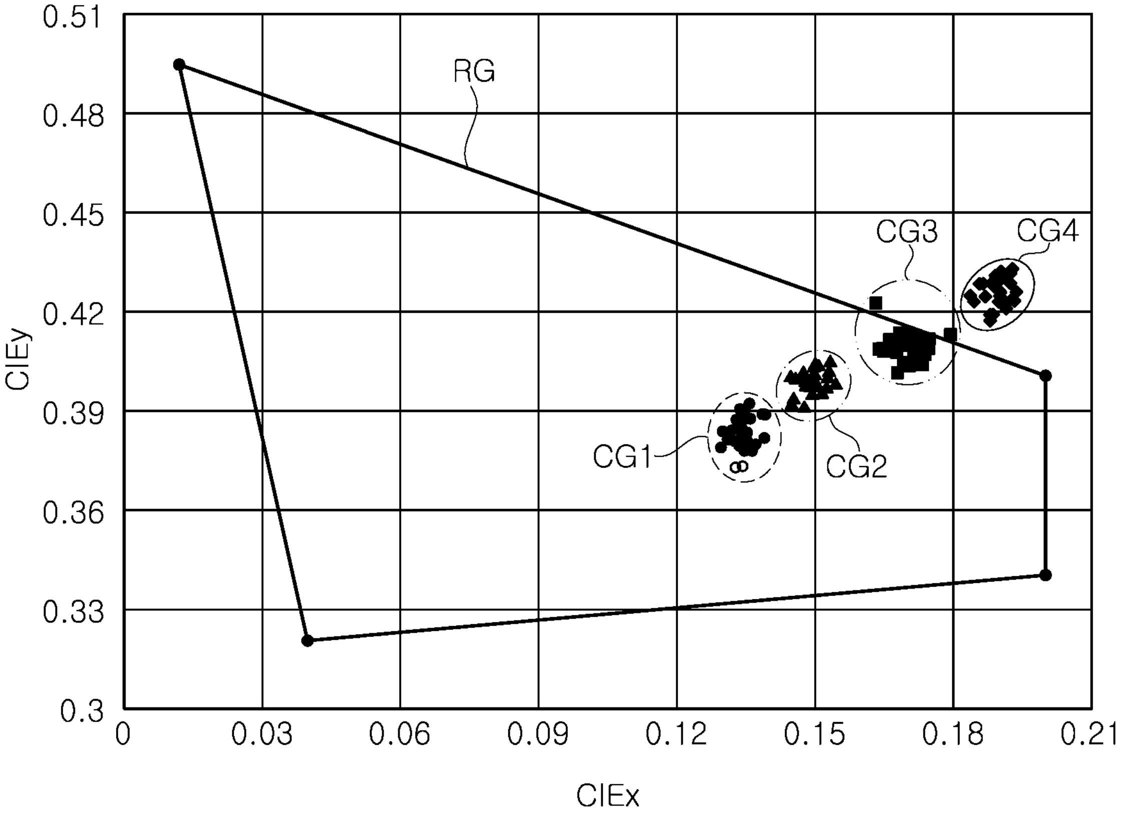

【FIG. 25】
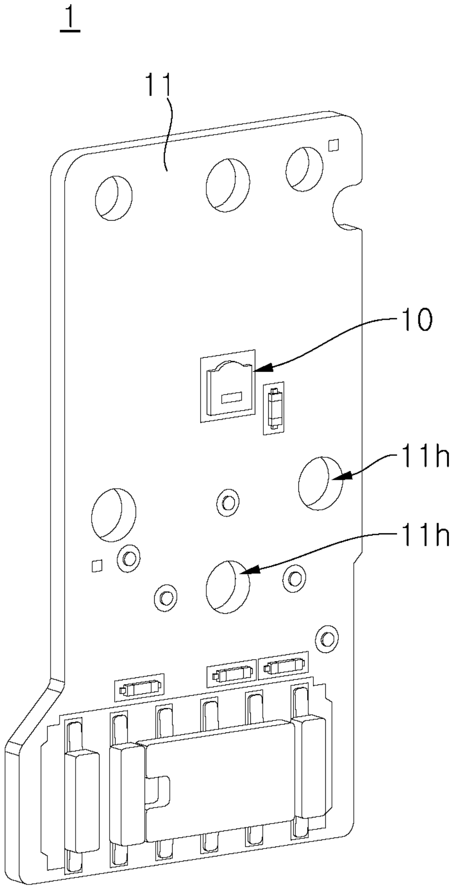

【FIG. 26】
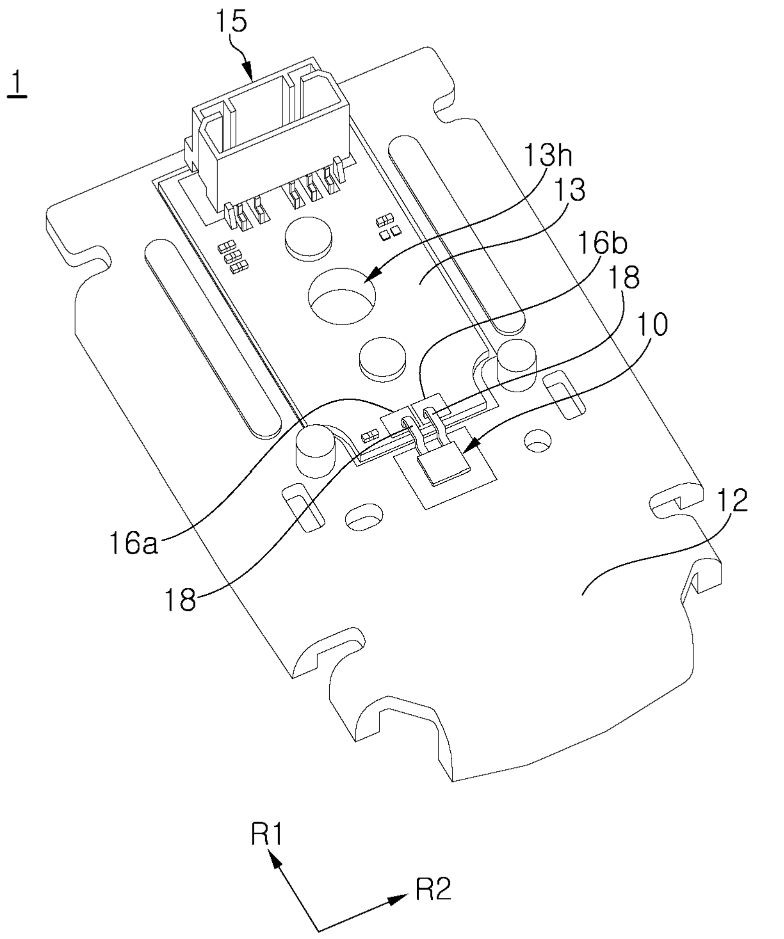

LIGHT SOURCE MODULE

TECHNICAL FIELD

The present invention relates to a light source module, and more particularly to a light source module including a heat dissipation pad.

BACKGROUND ART

Light emitting diodes are inorganic light sources and are rapidly replacing traditional light sources due to long lifespan and low power consumption thereof.

Since the development of light emitting diodes, application of light emitting diodes has expanded to backlight units, lighting, vehicular headlamps, and the like.

For example, a vehicle uses a variety of light source modules for safety of the driver, drivers of other vehicles, and pedestrians. Vehicular lighting emits various colors at different locations to help other drivers and pedestrians identify the state of the vehicle, and vehicles generally use red, yellow, green, and blue light to indicate various vehicular states.

Various attempts have been continuously made to apply new technologies to vehicles and there is a need for development of a novel light source module to indicate vehicular states related to these technologies either inside or outside a vehicle.

In addition, since light emitting diode packages used in vehicular light source modules emit high-intensity light in a confined space, the vehicular light emitting diode packages have characteristics of much higher ambient temperatures around the light emitting diodes than other fields. Therefore, there is a need for development of a light source module having heat dissipation characteristics for such application.

DISCLOSURE

Technical Problem

It is one aspect of the present invention to provide a light source module that can concentrate light generated from a light emitting diode chip to improve straightness while effectively dissipating heat in operation.

It is another aspect of the present invention to provide a light source module applicable as vehicular lighting.

It is a further aspect of the present invention to provide a light source module capable of improving structural reliability and optical reliability by preventing degradation of a wavelength conversion material.

It is yet another aspect of the present invention to provide a light source module capable of improving structural reliability through improvement in adhesion between components.

Technical Solution

In accordance with one embodiment of the present invention, a light source module includes a light emitting diode package, wherein the light emitting diode package includes: a substrate, a first upper electrode and a second upper electrode disposed on an upper surface of the substrate, a light emitting structure disposed on an upper surface of the first upper electrode and electrically connected to the first and second upper electrodes, a wavelength conversion portion disposed corresponding to a light emitting region on an upper surface of the light emitting structure, a first lower electrode and a second lower electrode disposed on a lower surface of the substrate and electrically connected to the first and second upper electrodes, respectively, and a heat dissipation pad disposed on the lower surface of the substrate to be spaced apart from the first and second lower electrodes.

A length (a) of the wavelength conversion portion in a first direction may have a value in the range of 0.7 to 0.9 times a length (c) of the heat dissipation pad in the first direction.

A length (b) of the wavelength conversion portion in a second direction may have a value in the range of 0.6 to 0.8 times the sum of a length (d) of the heat dissipation pad and a length (e) of the first and second lower electrodes in the second direction.

In one embodiment, an air path (AP) may be formed along side surfaces of the heat dissipation pad and the first and second lower electrodes to allow air to flow along the side surfaces thereof.

Advantageous Effects

The present invention can provide a light source module that can concentrate light generated from a light emitting diode chip to improve straightness while effectively dissipating heat in operation.

The present invention can provide a light source module applicable as vehicular lighting.

The present invention can provide a light source module capable of improving structural reliability and optical reliability by preventing degradation of a wavelength conversion material.

The present invention can provide a light source module capable of improving structural reliability through improvement in adhesion between components.

DESCRIPTION OF DRAWINGS

FIG. 1 is a diagram illustrating color coordinates of a light emitting diode package according to an embodiment of the present invention.

FIG. 2A to FIG. 2E are a top view, a bottom view, and side views of a light emitting diode package according to one embodiment of the present invention, respectively.

FIG. 3 is a top view of the light emitting diode package of FIG. 2A, with a wavelength conversion portion omitted therefrom.

FIG. 4 is a cross-sectional view taken in direction A-A' of FIG. 2A.

FIG. 5 is a cross-sectional view of a light emitting structure provided to the light emitting diode package of FIG. 1A.

FIG. 6 and FIG. 7 are enlarged views of some region of FIG. 4.

FIG. 8 is an enlarged view of region R of FIG. 5.

FIG. 9 is an enlarged view of some configuration of FIG. 4.

FIG. 10 is an enlarged view of region F of FIG. 9.

FIG. 11 is a cross-sectional view of a light emitting diode package according to another embodiment of the present invention.

FIG. 13 to FIG. 15 are side views of light emitting diode packages according to other embodiments of the present invention.

FIG. 16 is a diagram illustrating color coordinates of light emitting diode packages according to embodiments of the present invention.

FIG. 17 and FIG. 18 are graphs depicting emission spectra of the light emitting diode packages according to the embodiments of the present invention.

FIG. 19 to FIG. 23 are side views of light emitting diode packages according to other embodiments of the present invention.

FIG. 24 is a diagram illustrating color coordinates of light emitting diode packages according to embodiments of the present invention depending on the content of a wavelength conversion material.

FIG. 25 is a perspective view of a light source module including a light emitting diode package according to an embodiment of the present invention.

FIG. 26 is a perspective view of a light source module according to another embodiment of the present invention.

DETAILED DESCRIPTION

Figure 12:
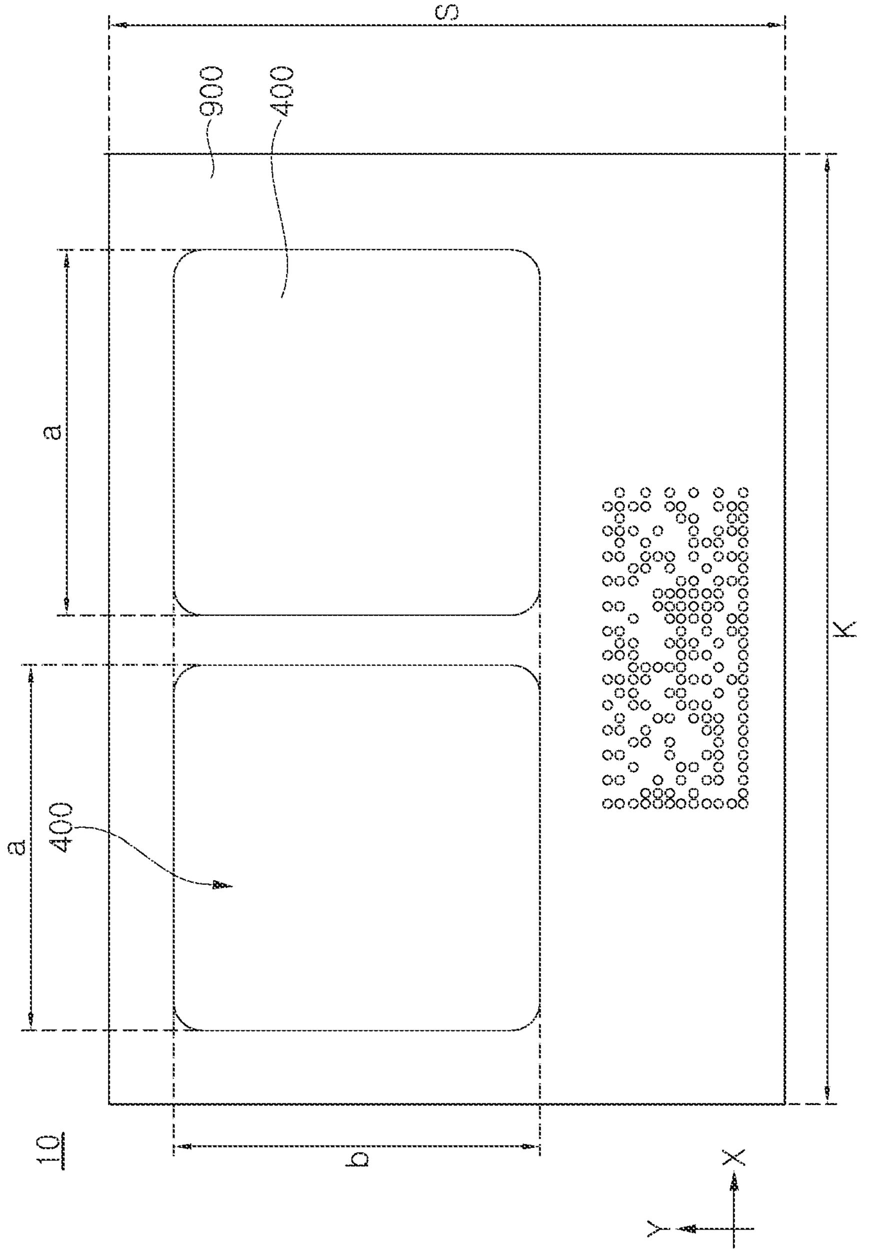
FIG. 12 is a top view of a light emitting diode package according to a further embodiment of the present invention.

Hereinafter, exemplary embodiments of the present invention will be described with reference to the accompanying drawings. However, it should be understood that the present invention is not limited to particular embodiments disclosed herein and includes all modifications, equivalents and substitutions within the spirit and scope of the invention.

The present invention provides one or more light emitting structures, light emitting diode packages and light source modules. Hereinafter, exemplary embodiments of the present invention will be described in more detail with reference to the accompanying drawings.

FIG. 1 illustrates the color coordinates of a light source module 1 and a light emitting diode package 10 according to embodiments of the present invention. The light emitting diode package 10 according to the embodiment of the present invention may emit white light, yellow light or cyan light.

More specifically, the light emitting diode package 10 provided to the light source module 1 according to the embodiment of the present invention may be applied to lighting that indicates a state of a vehicle.

Vehicles use a variety of lights for safety of drivers, drivers of other vehicles, and pedestrians. For example, vehicular lights may include lighting for driver visibility, such as headlamps, fog lamps, and the like.

In addition, the vehicular lights may include lamps for illuminating the interior of the vehicle, such as interior lamps and the like, and lamps to alert other drivers and pedestrians of the state of the vehicle, such as turn signal lamps, emergency flash lamps, reverse lamps, brake lamps, and the like.

As such, a vehicle includes vehicular lights having various purposes and the vehicular lights emit various colors at different locations to help other drivers and pedestrians identify the state of the vehicle.

For example, headlamps may emit white or yellow light, turn signal lamps may emit yellow light, and emergency flash lamps, tail lamps, and brake lamps may emit red light.

In addition, the vehicle may further include lamps that alert the driver of the state of the vehicle within the vehicle, such as a seatbelt-not fastened-warning lamp, a door open-warning lamp, a low fuel-warning lamp, an engine-warning lamp, and warning lamps that indicate operation of exterior vehicular lights, and the like.

Lamps inside the vehicle may generally emit one of red light, yellow light, green light, and blue light to alert the driver of the state of the vehicle. As such, the vehicles use various types of vehicular lights, each of which emits one of white, red, yellow, green, and blue light.

Thus, when novel technology is applied to a vehicle, there is a need for lighting that display the state of the vehicle related to the technology such that the state of the vehicle can be seen from inside or outside the vehicle. Furthermore, the lighting applied to the novel technology needs to emit light of a different color from light emitted from other lighting to distinguish the light from signals indicating other states of the vehicle.

For example, the light source module 1 and the light emitting diode package 10 according to the embodiments of the invention may be applied to lighting for indicating autonomous driving inside and outside a vehicle. Here, light emitted from the light source module 1 and the light emitting diode package 10 according to the embodiments may be cyan light.

More specifically, the light source module 1 and the light emitting diode package 10 according to the present invention may emit light included in a cyan light range RG displayed in the color coordinates of FIG. 1. Here, the color coordinates may be the color coordinates established by the International commission on illumination (CIE).

Further, the cyan light range RG shown in FIG. 1 is a color coordinate range corresponding to cyan light, which is light emitted from the light source module 1 and the light emitting diode package 10 according to the embodiments of the invention.

Referring to FIG. 1, light emitted from the light source module 1 and the light emitting diode package 10 may have color coordinates included in a range defined by connecting four coordinates $PT_a$, $PT_b$, $PT_c$, $PT_d$.

Here, the coordinates (x, y) of $PT_a$ are (0.04, 0.32), the coordinates of $PT_b$ are (0.012, 0.494), the coordinates of $PT_c$ are (0.2, 0.4), and the coordinates of $PT_d$ are (0.2, 0.32).

Light emitted from the light source module 1 and the light emitting diode package 10 according to this embodiment may have color coordinates placed inside a rectangular defined by sequentially connecting the coordinates $PT_a$, $PT_b$, $PT_c$, $PT_d$, $PT_a$ in a straight line. The light source module 1 and the light emitting diode package 10 according to the embodiments of the invention may be applied to lighting for driving. Here, light emitted from the light source module 1 and the light emitting diode package 10 according to the embodiments of the invention may be white light.

Referring to FIG. 1, light emitted from the light source module 1 and the light emitting diode package 10 may have color coordinates included in the range defined by connecting the four coordinates $PW_a$, $PW_b$, $PW_c$, and $PW_d$.

Here, the coordinates (x, y) of $PW_a$ are (0.25, 0.25), the coordinates of $PT_b$ are (0.25, 0.40), the coordinates of $PT_c$ are (0.35, 0.40), and the coordinates of $PT_d$ are (0.35, 0.25).

Light emitted from the light source module 1 and the light emitting diode package 10 according to this embodiment may have color coordinates placed inside a rectangular defined by sequentially connecting the coordinates $PW_a$, $PW_b$, $PW_c$, $PW_d$, $PW_a$ in a straight line.

Referring to FIG. 2A to FIG. 4, the light emitting diode package 10 provided to the light source module 1 according to one embodiment of the present invention includes a substrate 100, a first upper electrode 210 and a second upper electrode 220 disposed on an upper surface of the substrate, a light emitting structure 300 disposed on an upper surface of the first upper electrode 210 and electrically connected to the first and second upper electrodes 210, 220, a wavelength conversion portion 400 disposed corresponding to a light emitting region LA on an upper surface of the light emitting structure 300, a first lower electrode 510 and a second lower electrode 520 disposed on a lower surface of the substrate 100 and electrically connected to the first and second upper electrodes 210, 220, respectively, and a heat dissipation pad 700 disposed on the lower surface of the substrate to be spaced apart from the first and second lower electrodes 510, 520.

The substrate 100 is a support substrate for the light emitting diode package and may have configurations for electrical connection and heat dissipation of the light emitting diode package. Specifically, the substrate 100 may include a base and a conductive pattern.

By way of example, the base may be formed of at least one of a phenol resin, an epoxy resin, a polyimide resin, or a ceramic material. That is, the base may be formed of an insulating material.

In addition, the base may include a metal layer and an insulating layer formed on a surface of the metal layer. For example, the insulating layer may be an insulating resin or an oxide. That is, the base may have a structure that can be insulated from the conductive pattern. Further, the base is not limited thereto and may be formed of various materials or may have various structures insulated from the conductive pattern.

The conductive pattern may be formed on upper and lower surfaces of the base. In addition, the conductive pattern may be further formed on an interior or side surface of the base to electrically connect the conductive pattern formed on the upper surface of the base to the conductive pattern formed on the lower surface of the base. The conductive pattern may be formed of any conductive material. In one example, the conductive pattern may be formed of copper. As such, the conductive pattern formed on the base may be electrically connected to the light emitting structure 300. Thus, the light emitting structure 300 may be supplied with voltage and current for operation through the conductive pattern.

In addition, the substrate may be an aluminum nitride (AlN) based ceramic substrate with high thermal conductivity and may contain various fillers in consideration of thermal properties. The fillers may include, for example, $Y_2O_3$, $TiO_2$, $SiO_2$, or the like. The fillers may have a diameter of less than 10 micrometers and may have further improved heat dissipation characteristics by increasing a surface area of the fillers through reduction in size of the fillers.

The substrate 100 may have a thickness of 300 micrometers to 400 micrometers, without being limited thereto, and may be formed to various thicknesses, as needed.

The substrate 100 may have a rectangular shape in plan view. In plan view, the substrate 100 may have a first direction (X-axis direction with reference to the drawing) length (k) and a second direction (Y-axis direction with reference to the drawing) length (s), which is perpendicular to the first direction, to form a rectangular shape in which the first direction length (k) is shorter than the second direction length (s).

The first upper electrode 210 and the second upper electrode 220 are electrode members disposed on the upper surface of the substrate 100 and may have various configurations.

FIG. 3 is a top view of the light emitting diode package 10 of FIG. 2A with the wavelength conversion portion 400 described below removed therefrom, showing the first upper electrode 210 and the second upper electrode 220.

The first upper electrode 210 is an electrode providing a mounting area, on which the light emitting structure 300 described below is placed, and may have a larger area than the second upper electrode 220.

When the area of the first upper electrode 210 is defined as AR1 and the area of the second upper electrode 220 is defined as AR2, the area AR1 of the first upper electrode 210 may cover 70% or more of the total area of the upper surface of the substrate 100. Since the first upper electrode 210 is a continuously formed electrode and covers 70% or more of the total area of the upper surface of the substrate 100, generated heat can be uniformly dissipated at a high speed therethrough.

The first upper electrode 210 may be electrically connected to the light emitting structure 300 described below and may be spaced apart from the second upper electrode 220.

The first upper electrode 210 may form an extension region extending outwards from one side of the mounting region, in which the light emitting structure 300 is mounted, and a semiconductor structure 600 may be mounted in the extension region.

The semiconductor structure 600 may be a structure composed of a plurality of semiconductor layers and may be, for example, a Zener diode.

The semiconductor structure 600 may be connected in reverse parallel to the light emitting structure 300 such that the light emitting structure 300 can operate at a stable voltage.

Referring to FIG. 8 and FIG. 9, the semiconductor structure 600 may be attached to the first upper electrode 210 via a bonding layer (paste) 602. The bonding layer (paste) 602 may be formed of an electrically conductive material.

The second upper electrode 220 is an electrode spaced apart from the first upper electrode 210 and disposed at one side of the upper surface of the substrate 100, and may have various configurations.

Referring to FIG. 3, the second upper electrode 220 may be disposed biased to one side of the upper surface of the substrate 100 to be placed, for example, at one side adjacent to the semiconductor structure 600. Here, the semiconductor structure 600 may be electrically connected to the second upper electrode 220 through a wire W.

The second upper electrode 220 may also be electrically connected to the light emitting structure 300.

The first and second upper electrodes 210, 220 may be formed of various materials, for example, copper (Cu), so long as the materials are electrically conductive metals. In addition, the first and second upper electrodes 210, 220 may be formed to a thickness of 40 micrometers to 60 micrometers.

FIG. 6 is an enlarged view of the first and second upper electrodes 210, 220, showing an interface between the first and second upper electrodes 210, 220 and the substrate 100.

In the process of forming the first and second upper electrodes 210, 220 on the upper surface of the substrate 100, a portion of the first and second upper electrodes 210, 220 may penetrate into the upper surface of the substrate 100 to a certain depth, whereby a metallic penetration area PA can be formed at the interface between the first and second upper electrodes 210, 220 and the substrate 100.

The metallic penetration area PA may increase a bonding surface area with the substrate 100. Thus, heat dissipation in a downward direction through the substrate 100 may be further improved through heat conduction by the metallic penetration area PA.

On the other hand, a metal layer 230 may be disposed on the upper surfaces of the first and second upper electrodes 210, 220 and may include at least one material of Ti, W, Ni, Pd, Al, Au, Sn, or Cu. The metal layer 230 may be composed of a plurality of metal layers by taking into account the coefficient of thermal expansion and thermal conduction properties of each metal, and may have, for example, a structure in which at least one layer of Ni, Pb or Au is stacked on a Cu layer. However, it should be understood that the present is not limited thereto and the metal layer may be formed of a single conductive material layer.

The light emitting structure 300 is a semiconductor structure disposed on the upper surface of the first upper electrode 210 and electrically connected to the first and second upper electrodes 210, 220 and may have various configurations. By way of example, the light emitting structure 300 may be a light emitting diode including a semiconductor layer that generates and emits light in application of voltage and current through the substrate 100.

Referring to FIG. 5, the light emitting structure 300 may include a first conductivity type semiconductor layer 310, a second conductivity type semiconductor layer 330, and an active layer 320, wherein the first conductivity type semiconductor layer 310 is placed on the second conductivity type semiconductor layer 330 and the active layer 320 is interposed between the first conductivity type semiconductor layer 310 and the second conductivity type semiconductor layer 330.

The first conductivity type semiconductor layer 310 and the second conductivity type semiconductor layer 330 may include III-V, III-VI and other compound semiconductors, and may include, for example, a nitride-based semiconductor, such as (Al, Ga, In)N.

The first conductivity type semiconductor layer 310 may include an n-type semiconductor layer doped with an n-type dopant (for example, Si) and the second conductivity type semiconductor layer 330 may include a p-type semiconductor layer doped with a p-type dopant (for example, Mg). Conversely, the first conductivity type semiconductor layer 310 may be a p-type semiconductor layer and the second conductivity type semiconductor layer 330 may be an n-type semiconductor layer.

The active layer 320 may be a layer that generates light through recombination of electrons injected through the first semiconductor layer and holes injected through the second semiconductor layer. The light generated from the active layer 320 may be emitted to the outside of the light emitting structure 300 through the first conductivity type semiconductor layer 310 and the second conductivity type semiconductor layer 330.

The active layer 320 may be formed in any structure selected from among a single well structure, a multi-well structure, a single quantum well structure, a multi-quantum well (MQW) structure, a quantum dot structure, or a quantum line structure.

The active layer 320 may include at least one barrier layer and a plurality of well layers. The well layers may be formed of $In_xGa_{(1-x)}N$ ($0 \leq x \leq 1$) and the barrier layer may be formed of $In_xAl_yGa_{(1-x-y)}N$ ($0 \leq x \leq 1$, $0 \leq y \leq 1$). For example, the well layers may have an indium (In) content of 28% to 32%. In addition, the well layers may have a greater indium content than the barrier layer. For example, the well layers may have an energy bandgap of about 2.5 eV to 2.58 eV.

Specifically, the active layer 320 may include a multi-quantum well structure (MQW), and elements constituting the multi-quantum well structure and a composition thereof may be adjusted such that the multi-quantum well structure can emit light having a desired peak wavelength.

Further, the light emitting structure 300 may include a growth substrate for growth of semiconductor layers. For example, the growth substrate may be formed of a material selected from sapphire ($Al_2O_3$), SiC, GaAs, GaN, ZnO, Si, GaP, InP, or Ge.

The light emitting structure 300 may produce different types of light depending on the types of compositions constituting the first conductivity type semiconductor layer 310, the active layer 320, and the second conductivity type semiconductor layer 330.

For example, the light emitting structure 300 may emit blue light that has a peak wavelength in the wavelength band of about 430 nm to 470 nm. Alternatively, the light emitting structure 300 may emit cyan light that has a peak wavelength in the wavelength band of about 485 nm to 495 nm. Alternatively, the light emitting structure 300 may emit cyan light that has a peak wavelength of about 490 nm.

Referring to FIG. 8, the first conductivity type semiconductor layer 310 may have irregularities 332 formed on an upper surface thereof by increasing surface roughness thereof. The irregularities 332 of the first conductivity type semiconductor layer 310 may be formed by performing surface treatment on the surface of the first conductivity type semiconductor layer 310 using at least one of various methods, such as dry etching, wet etching, electrochemical etching, and the like.

The irregularities 332 may be formed on the upper surface of the first conductivity type semiconductor layer 310, thereby improving light extraction efficiency of light emitted through the upper surface of the light emitting diode.

On the other hand, at least one groove z may be formed under the second conductivity type semiconductor layer 330. The groove z may be formed by partially removing the second conductivity type semiconductor layer 330, the active layer 320, and the first conductivity type semiconductor layer 310.

The first conductivity type semiconductor layer 310 may be exposed by the groove z, and the groove z may have a trapezoidal shape with sloped side surfaces.

Obviously, the shape, number and location of the grooves z may be modified in various ways.

A second electrode layer 340 may be placed on a lower surface of the second conductivity type semiconductor layer 330 to be electrically connected to the second conductivity type semiconductor layer 330. A portion of the second electrode layer 340 may extend farther to one side of the light emitting structure to expose an upper surface thereof.

Referring to FIG. 3, an electrode pad 380 may be disposed on the exposed upper surface of the second electrode layer 340. Since the electrode pad 380 is disposed on the exposed upper surface of the second electrode layer 340, the electrode pad may not interfere with the light emitting region LA of the light emitting structure 300.

The electrode pad 380 is electrically connected to the second upper electrode 220 through the wire W, whereby the second electrode layer 340 can be electrically connected to the second upper electrode 220.

The second electrode layer 340 may be composed of a single metal layer or multiple metal layers. In another example, the electrode layer 340 may be composed of a conductive oxide layer.

An insulation layer 350 may be placed on a lower surface of the second electrode layer 340 to cover the second electrode layer 340. The insulation layer 350 may cover a side surface of the groove z and may expose a portion of the first conductivity type semiconductor layer 310.

A first electrode layer 360 may be placed on a lower surface of the insulation layer 350. The first electrode layer 360 may cover the insulation layer 350 and may be electrically connected to the first conductivity type semiconductor layer 310 exposed through the insulation layer 350.

The insulation layer 350 may be interposed between the second electrode layer 340 and the first electrode layer 360 to insulate the second electrode layer 340 from the first electrode layer 360.

The first electrode layer 360 may include a single metal layer or multiple metal layers. In another example, the first electrode layer 360 may include a conductive oxide layer.

A base 370 may be placed under the first electrode layer 360. The base 370 may be electrically connected to the first electrode layer 360 and may include a heat dissipation portion 390 for heat transfer.

The heat dissipation portion 390 may be composed of a thermally conductive member and may also function as an electrically conductive member electrically connected to the second electrode layer 360.

The heat dissipation portion 390 may include a plurality of layers and may include at least one of Ti, W, Ni, Pd, Al, Au, or Sn. The heat dissipation portion 390 may include a material having a lower coefficient of thermal expansion than the base 370. In addition, the heat dissipation portion 390 may also include a material having a lower coefficient of thermal expansion than the first upper electrode 210. By disposing the heat dissipation portion 390 including a material having a low coefficient of thermal expansion between the first upper electrode 210 and the base 370, it is possible to prevent delamination of the base 370 from the first upper electrode 210 during operation.

The light emitting structure 300 may be mounted on the upper surface of the first upper electrode 210 and a bonding layer (paste) (not shown) may be placed between the light emitting structure 300 and the first upper electrode 210. The light emitting structure 300 may be attached to the upper surface of the first upper electrode 210 via the bonding layer. The bonding layer may be formed of an electrically conductive material.

Accordingly, the first electrode layer 360 of the light emitting structure 300 may be electrically connected to the first upper electrode 210.

The bonding layer for mounting the light emitting structure 300 may be physically spaced apart from the bonding layer 602 for mounting the semiconductor structure 600 described above, and may be formed of the same or different materials.

The wavelength conversion portion 400 is disposed corresponding to the light emitting region LA on the upper surface of the light emitting structure 300 and may have various configurations to emit light through excitation by a specific excitation wavelength.

Here, the light emitting diode package 10 may further include a reflective portion 900 that covers the upper surface of the substrate 100 while surrounding side surfaces of the light emitting structure 300 and the wavelength conversion portion 400.

The reflective portion 900 may include a light reflective material to allow light emitted from the light emitting structure 300 to be focused on the wavelength conversion portion 400.

Further, the reflective portion 900 may act as a barrier formed to surround the light emitting structure 300 and define a cavity 910 corresponding to a region in which the light emitting structure 300 is mounted.

The reflective portion 900 may also serve to protect the light emitting structure 300 from an external environment, such as dust, moisture, impact, and the like, and may be in close contact with or spaced apart from a side surface of the light emitting structure 300.

The reflective portion 900 may be formed of silicone, epoxy molding compound (EMC), or the like, and may include a resin white wall.

By way of example, the reflective portion 900 may include a light reflective material in a silicone resin.

Further, fillers may be added to the reflective portion 900. Here, the fillers may have a particle diameter of 10 micrometers or more.

The fillers of the reflective portion 900 may have a larger diameter than the fillers of the substrate 100.

Since a relatively large quantity of heat is generated in the substrate 100, the fillers contacting the substrate 100 may be formed to have a smaller diameter than the fillers in the reflective portion 900 to increase a contact surface area, thereby preventing the substrate 100 from cracking.

Further, the fillers of the substrate 100 may have a higher melting temperature than the fillers of the reflective portion 900. Accordingly, deformation of the substrate 100 due to heat generation can be prevented.

The fillers of the reflective portion 900 and the fillers of the substrate 100 may include different types of elements. Furthermore, the fillers of the reflective portion 900 and the fillers of the substrate 100 may include different elements and the same elements. By including the same elements in the fillers of the reflective portion 900 and the fillers of the substrate 100, adhesion in a contact region between the substrate 100 and the reflective portion 900 can be improved to prevent moisture permeation therethrough.

A plurality of spots may be further formed on an upper surface of the reflective portion 900 to be spaced apart from one another and to suppress light reflection that can occur on the upper surface of the reflective portion 900, thereby reducing light spreading to an unintended region. Alternatively, the spots may transmit information of the light emitting diode package to the outside.

The first lower electrode 510 and the second lower electrode 520 are electrode members disposed on a lower surface of the substrate to be electrically connected to the first and second upper electrodes 210, 220, respectively, and may have various configurations.

FIG. 2B illustrates a lower surface of the light emitting diode package of FIG. 2A, showing the first lower electrode 510 and the second lower electrode 520.

The first lower electrode 510 may be connected to the first upper electrode 210 through a via-electrode (not shown) penetrating through the substrate 100 and the second lower electrode 520 may be connected to the second upper electrode 220 through a via-electrode (not shown) penetrating through the substrate 100.

The first and second lower electrodes 510, 520 may be formed of various materials so long as the corresponding materials are electrically conductive metals and may be formed of at least one of, for example, Cu, Ti, W, Ni, Pd, Al, Au, or Sn. Further, the first and second lower electrodes 510, 520 may be formed to a thickness (t) of 50 micrometers to 70 micrometers.

FIG. 7 is an enlarged view of the first and second lower electrodes 510, 520, showing an interface between the first and second lower electrodes 510, 520 and the substrate 100.

In the process of forming the first and second lower electrodes 510, 520 on the lower surface of the substrate 100, a portion of the first and second lower electrodes 510, 520 may penetrate into the lower surface of the substrate 100 to a certain depth, whereby a metallic penetration area PA can be formed at the interface between the first and second lower electrodes 510, 520 and the substrate 100. The metallic penetration area PA may increase a bonding surface area with the substrate 100. Thus, heat dissipation through the substrate 100 in the downward direction can be further improved through heat conduction by the metallic penetration area PA.

The first and second lower electrodes 510, 520 may include at least one material of Ti, W, Ni, Pd, Al, Au, Sn, or Cu.

The heat dissipation pad 700 is a heat dissipation member disposed on the lower surface of the substrate 100 to be spaced apart from the first and second lower electrodes 510, 520 and transfers heat generated from the light emitting structure 300, thereby suppressing temperature increase.

The heat dissipation pad 700 may further include a heat dissipation portion (not shown) that penetrates the substrate 100.

On the other hand, referring to FIG. 3, the light emitting diode package according to the present invention may be configured such that the wavelength conversion portion 400 has a smaller area than the light emitting structure 300 in plan view, thereby improving straightness of light generated from the light emitting structure 300.

Specifically, the upper surface of the light emitting structure 300 may have a first direction (X-axis direction with reference to the drawing) length (g) and a second direction (Y-axis direction with reference to the drawing) length h perpendicular to the first direction in plan view, and have various planar shapes. For example, the upper surface of the light emitting structure 300 may have a rectangular shape.

Similarly, the wavelength conversion portion 400 is a layer covering a region corresponding to the light emitting region LA of the light emitting structure 300, may have a first direction length (a) and a second direction length (b) in plan view, and may be configured in various planar shapes. For example, the upper surface of the wavelength conversion portion 400 may have a rectangular shape. In plan view, the shape and size of the wavelength conversion portion 400 may be the same as or substantially similar to the shape and size of the light emitting region LA of the light emitting structure 300. Specifically, the wavelength conversion portion 400 may have a rounded rectangular shape with rounded vertices (corners) in plan view.

Here, the first direction length (g) of the light emitting structure 300 may be in the range of 1 to 1.1 times the first direction length (a) of the wavelength conversion portion 400, and the second direction length (h) of the light emitting structure 300 may be greater than the second direction length (b) of the wavelength conversion portion 400 and may be in the range of 1.1 to 1.3 times the second direction length (b) of the wavelength conversion portion 400.

Accordingly, a portion of the upper surface of the light emitting structure 300 forms an exposed region not covered by the wavelength conversion portion 400, in which the exposed region is a region over which the second electrode layer 340 described above extends such that the electrode pad 380 can be disposed on the second electrode layer 340.

Furthermore, the light emitting diode package according to the present invention can maximize heat dissipation performance of the light emitting diode package through the shapes and sizes of the light emitting structure 300, the wavelength conversion portion 400, the first and second lower electrodes 510, 520 and the heat dissipation pad 700.

Specifically, referring to FIG. 2B, the first and second lower electrodes 510, 520 may have a first direction length (f) and a second direction length (e) in plan view, and may be configured in various planar shapes. For example, the first and second lower electrodes 510, 520 may have a rectangular shape in plan view. More specifically, the first and second lower electrodes 510, 520 may have a rounded rectangular shape with rounded vertices (corners) in plan view. Accordingly, curved surfaces may be formed in some regions of side surfaces of the first and second lower electrodes 510, 520.

The first and second lower electrodes 510, 520 may be disposed side by side to be spaced apart by a preset first distance D1 in the first direction.

The first and second lower electrodes 510, 520 may also be disposed biased to one side in the second direction.

Accordingly, the heat dissipation pad 700 may be disposed at one side of the first and second lower electrodes 510, 520 in the second direction to be spaced apart therefrom by a preset second distance D2. Here, the heat dissipation pad 700 may have a first direction length (c) and a second direction length (d) in plan view, and may be configured in various planar shapes. For example, the heat dissipation pad 700 may have a rectangular shape in plan view. More specifically, the heat dissipation pad 700 may have a rounded rectangular shape with rounded vertices (corners) in plan view. Accordingly, curved surfaces may be formed in some regions of side surfaces of the heat dissipation pad 700.

The first and second lower electrodes 510, 520 may have a rectangular shape in which the first direction length (f) is shorter than the second direction length (e), and the heat dissipation pad 700 may have a rectangular shape in which the first direction length (c) is longer than the second direction length (d).

Here, the first direction length (a) of the wavelength conversion portion 400 may have a value in the range of 0.7 times to 0.9 times the first direction length (c) of the heat dissipation pad 700. As the first direction length (c) of the heat dissipation pad 700 is formed to be longer than the first direction length (a) of the wavelength conversion portion 400, the heat dissipation pad 700 can secure as large a size as possible and can improve heat dissipation performance by discharging heat, which can proceed to the wavelength conversion portion 400, in the downward direction.

Further, the second direction length (b) of the wavelength conversion portion 400 may have a value in the range of 0.6 times to 0.8 times the sum (d+e) of the second direction length (d) of the heat dissipation pad 700 and the second direction length (e) of the first and second lower electrodes 510, 520.

Further, the ratio (c/e) of the first direction length (c) of the heat dissipation pad 700 to the second direction length (e) of the first and second lower electrodes 510, 520 may be in the range of 1.2 to 1.8. By forming the first direction length (c) of the heat dissipation pad 700 to be longer than the second direction length (e) of the first and second lower electrodes 510, 520, the heat dissipation effect through the heat dissipation pad 700 can be improved.

Further, the ratio (d/c) of the second direction length (d) of the heat dissipation pad 700 to the first direction length (c)

of the heat dissipation pad 700 may be less than the ratio (f/e) of the first direction length (f) of the first and second lower electrodes 510, 520 to the second direction length (e) of the first and second lower electrodes 510, 520.

Further, the ratio (d/f) of the second direction length (d) of the heat dissipation pad 700 to the first direction length (f) of the first and second lower electrodes 510, 520 may be less than 1.2.

On the other hand, since the first and second lower electrodes 510, 520 can also perform heat dissipation to the bottom of the package together with the heat dissipation pad 700, a larger area may be advantageous for heat dissipation. However, when the areas of the first and second lower electrodes 510, 520 and the heat dissipation pad 700 are excessively larger than the areas of the first and second upper electrodes 210, 220, the substrate 100 can be bent due to a difference in thermal expansion between the upper and lower surfaces of the substrate 100. Accordingly, the sum (AR1+AR2) of the areas of the first and second upper electrodes 210, 220 may be set in the range of 0.8 times to 1.2 times the sum (BR1+BR2+BR3) of the areas of the heat dissipation pad 700 and the first and second lower electrodes 510, 520.

Further, the light emitting diode package according to the present invention may include an air path structure to further improve the heat dissipation effect.

Specifically, the heat dissipation pad 700 and the first and second lower electrodes 510, 520 may protrude from the lower surface of the substrate 100 by a preset height t, thereby forming an air path AP along the side surfaces of the heat dissipation pad 700 and the first and second lower electrodes 510, 520 to allow air to flow along the side surfaces thereof.

The air path AP may include a first airflow path P1 formed between the heat dissipation pad 700 and the first lower electrode 510, a second airflow path P2 formed between the heat dissipation pad 700 and the second lower electrode 520, and a third airflow path P3 formed between the first lower electrode 510 and the second lower electrode 520.

As the heat dissipation pad 700 is spaced apart from the first and second lower electrodes 510, 520 by a second distance D2 in the second direction, the width of each of the first airflow path P1 and the second airflow path P2 may be the same as the second distance D2.

As the first lower electrode 510 and the second lower electrode 520 are spaced apart from each other by a first distance D1 in the first direction, the width of the third airflow path P3 may be the same as the first distance D1.

Here, the width D2 of each of the first airflow path P1 and the second airflow path P2 may have a value in the range of 90% to 110% of the width D1 of the third airflow path P3 and the width D1 may be the same as the width D2.

On the other hand, the air path AP may further include a fourth airflow path P4 formed in a region where the first airflow path P1, the second airflow path P2, and the third airflow path P3 intersect.

The fourth airflow path P4 may be an intermediate region where the first airflow path P1, the second airflow path P2 and the third airflow path P3 merge and are branched off. As shown in FIG. 2B, the fourth airflow path P4 is a region at least partially surrounded by the first and second lower electrodes 510, 520 and the heat dissipation pad 700 and may form a rectangular region having the width D1 in the first direction and the width D2 in the second direction.

The substrate 100 may include a central point SC of the lower surface thereof, wherein the central point SC may be an intersection of imaginary lines diagonally connecting vertices of the substrate 100. In plan view, a central point AC of the fourth airflow path P4 may be placed biased to the heat dissipation pad 700 with reference to the central point SC of the lower surface of the substrate 100.

That is, the central point AC of the fourth airflow path P4 is placed on the same second direction imaginary line L as the central point SC of the lower surface of the substrate 100, but may be placed at a location spaced apart from the central point SC of the lower surface of the substrate 100 in the second direction.

In addition, the air path AP may further include an outer airflow path OP formed along an outer circumference surrounding the heat dissipation pad 700, the first lower electrode 510, and the second lower electrode 520.

Here, a width D3 of the outer airflow path OP may be less than or equal to 0.5 times the width D1 of the third airflow path P3.

The light emitting diode package according to the present invention can maximize the heat dissipation effect through an air cooling structure by forming a space between the first and second lower electrodes 510, 520 and the heat dissipation pad 700 on the lower surface of the substrate 100 to form the air path AP along which air can move.

On the other hand, at least one of the first airflow path P1, the second airflow path P2, and the third airflow path P3 may include at least some region that varies in width as the corresponding air path approaches the fourth airflow path P4.

For example, at least one of the first airflow path P1, the second airflow path P2, or the third airflow path P3 may include at least some region that increases in width as the corresponding air path approaches the fourth airflow path P4.

As the width of the flow path increases as the flow path approaches the fourth airflow path P4, air circulation can be effectively achieved.

In addition, the side surfaces of the first, second lower electrode 510, 520 forming the first airflow path P1 may be partially formed as curved surfaces. Accordingly, air can circulate smoothly along the curved surfaces formed on the side surfaces of the first and second lower electrodes 510, 520. Preferably, in plan view, regions corresponding to the vertices of the heat dissipation pad 700, the first lower electrode 510 and the second lower electrode 520 forming the air path AP and the outer airflow path OP are formed as curved surfaces, whereby external air can smoothly enter the air path AP from the outer airflow path OP.

In addition, referring to FIG. 2E, the present invention can improve heat dissipation characteristics through a relationship between the areas in which the heat dissipation pad 700 and the first and second lower electrodes 510, 520 overlap the substrate 100 or the wavelength conversion portion 400.

For example, the area of the heat dissipation pad 700 vertically overlapping the substrate 100 may be larger than the sum of the areas of the first and second lower electrodes 510, 520 vertically overlapping the substrate 100. By forming a larger area in which the heat dissipation pad 700 vertically overlaps the substrate 100, the heat dissipation characteristics through the heat dissipation pad 700 can be further improved.

In another example, the area of the heat dissipation pad 700 vertically overlapping the wavelength conversion portion 400 may be larger than the sum of the areas of the first and second lower electrodes 510, 520 vertically overlapping the wavelength conversion portion 400. By forming a larger area in which the heat dissipation pad 700 vertically overlaps the wavelength conversion portion 400, the heat dissipation characteristics through the heat dissipation pad 700 can be further improved.

In addition, when the wavelength conversion portion 400 has the first direction length (a) and the second direction length (b) in plan view, an imaginary line M passing through a central portion of the wavelength conversion portion 400 with reference to the second direction and parallel to the first direction may be placed biased to the heat dissipation pad 700.

That is, the imaginary line M is disposed closer to the heat dissipation pad 700 than to the first and second lower electrodes 510, 520. Here, the shortest distance from the imaginary line M to the side surface of the heat dissipation pad 700 may be smaller than the shortest distance from the imaginary line M to the side surface of the first or second lower electrode 510, 520. In this case, since the area where the wavelength conversion portion 400 vertically overlaps the heat dissipation pad 700 becomes larger than the area where the wavelength conversion portion 400 vertically overlaps the first and second lower electrodes 510, 520, the heat dissipation characteristics through the heat dissipation pad 700 can be improved.

In the light emitting diode package described above, the light emitting structure 300, the first and second upper electrodes 210, 220, the substrate 100, and the first and second lower electrodes 510, 520 correspond to a first thermal conductive layer, a second thermal conductive layer, a third thermal conductive layer, and a fourth thermal conductive layer, respectively, thereby enabling realization of effective heat transfer and heat dissipation from the first thermal conductive layer to the fourth thermal conductive layer.

Next, FIG. 11 is a cross-sectional view of a light emitting diode package 10 according to another embodiment of the present invention. Referring to FIG. 11, the wavelength conversion portion 400 may cover the entire upper surface of the light emitting structure 300, which corresponds to a light emission surface thereof, and may have a sloped surface CL formed on a side surface thereof such that the width of the wavelength conversion portion 400 is gradually narrowed in an upward direction for straightness and concentration of light.

Obviously, the light emitting diode package of FIG. 11 may have the same or similar configuration to the light emitting diode package of FIG. 2A to FIG. 10 except for the wavelength conversion portion 400.

Next, FIG. 12 is a top view of a light emitting diode package 10 according to a further embodiment of the present invention. Unlike the light emitting diode packages 10 shown in FIG. 2A to FIG. 11, the light emitting diode package 10 according to this embodiment may include a plurality of light emitting structures 300.

Specifically, as shown in FIG. 12, the light emitting diode package 10 may include two light emitting structures 300, that is, a first light emitting structure 300 and a second light emitting structure 300.

As the light emitting diode package 10 includes the first and second light emitting structures 300, the wavelength conversion portion 400 on the upper surface of the light emitting structure 300 may also be formed corresponding to each of the light emitting structures 300. Here, the two light emitting structures 300 may be spaced apart from each other in the horizontal direction.

The first light emitting structure 300 may emit light having a first peak wavelength and the second light emitting structure 300 may emit light having a second peak wavelength.

The first peak wavelength and the second peak wavelength may be the same or different. For example, the first peak wavelength and the second peak wavelength may have a difference of 5 nm or less.

In addition, light emitted from the first light emitting structure 300 may have different color coordinates (CIE) (X, Y) than light emitted by the second light emitting structure 300.

In addition, the light emitted from the first light emitting structure 300 and the light emitted from the second light emitting structure 300 may have different color temperatures.

In addition, the light emitted from the first light emitting structure 300 and the light emitted from the second light emitting structure 300 may have peak wavelengths having different full widths at half maximum (FWHM).

In addition, a difference between the dominant wavelength and the peak wavelength of the light emitted from the first light emitting structure 300 may be different from a difference between the dominant wavelength and the peak wavelength of the light emitted from the second light emitting structure 300. As a result, it is possible to realize light having different light characteristics in a single light emitting diode package 10.

In addition, the first light emitting structure 300 and the second light emitting structure 300 may be independently controlled to be independently lit or driven.

Thus, at least two light emitting structures 300 having different characteristics may be handled in the form of a single light emitting diode package 10 and light characteristics lacking in one light emitting structure 300 may be compensated for by the other light emitting structure 300.

Next, FIG. 13 illustrates a light emitting diode package 10 according to yet another embodiment of the present invention.

Referring to FIG. 13, the light emitting diode package 10 may include a light emitting structure 300, a substrate 100, a reflective portion 900, and a light transmitting portion 800. The light emitting diode package 10 shown in FIG. 13 may have the same or similar configuration to the light emitting diode package 10 described above, except that the light emitting diode package 10 according to this embodiment includes the light transmitting portion 800 instead of the wavelength conversion portion 400.

The light emitting structure 100 shown in FIG. 13 may generate light, which is as similar as possible to cyan light, in the semiconductor layer. That is, the light emitting structure 100 according to this embodiment may generate and emit cyan light emitted from the semiconductor layer without a wavelength conversion material. In addition, the light emitting diode package 10 shown in FIG. 13 may finally emit light corresponding to the color coordinates of cyan light even when the light emitting structure 100 includes a wavelength conversion layer 400 containing a small amount of wavelength conversion material.

Further, the light emitting structure 300 according to this embodiment shown in FIG. 13 may be mounted on the substrate 100 through flip-chip bonding. Electrodes of the light emitting structure 300 may directly contact the upper electrodes 210, 220 of the substrate 100 or may be electrically connected thereto through a conductive bonding agent.

The reflective portion 900 may be formed on an upper surface of the substrate 100 to surround a side surface of the light emitting structure 300. That is, the reflective portion 900 includes a cavity 910 and the light emitting structure 300 mounted on the upper surface of the substrate 100 may be placed in the cavity 910.

The reflective portion 900 may reflect light emitted from the light emitting structure 300. For example, the reflective portion 900 may include a light reflective material in a silicone resin.

Light emitted from the side surface of the light emitting structure 300 may be reflected by the reflective portion 900 to travel towards an upper side of the light emitting structure 300. That is, the reflective portion 900 may prevent the light emitted from the side surface of the light emitting structure 300 from dissipating instead of traveling towards the upper side of the light emitting structure 300. Thus, in the light emitting diode package 10 according to this embodiment, the reflective portion 900 allows the light emitted from the side surface of the light emitting structure 300 to be also emitted outside through an upper side of the light emitting structure 300, thereby improving luminous efficacy. Such a reflective portion 900 may also serve to protect the light emitting structure 300 from an external environment, such as dust, moisture, shock, and the like.

Referring to FIG. 13, the reflective portion 900 closely contacts the side surface of the light emitting structure 300. Alternatively, the reflective portion 900 may be formed such that an inner surface of the reflective portion 900 defining the cavity 910 is spaced apart from the side surface of the light emitting structure 300.

The light transmitting portion 800 may be formed on the light emitting structure 300 to fill the cavity 910 of the reflective portion 900. That is, the light transmitting portion 800 may be formed to cover a portion of the light emitting structure 300 exposed through the cavity 910 of the reflective portion 900.

The light transmitting portion 800 may be formed of a light transmitting material that allows light emitted from the light emitting structure 300 to pass therethrough. For example, the light transmitting portion 800 may be formed of at least one of an epoxy resin, a silicone resin, glass, or a ceramic material.

Light emitted from the light emitting structure 300 may be emitted to the outside of the light emitting diode package 10 through the light transmitting portion 800. That is, an upper surface of the light transmitting portion 800 may be a light emission surface of the light emitting diode package 10 through which light is emitted.

As such, the light emitting diode package 10 according to this embodiment emits light, that is, white light, yellow light or cyan light, emitted from the light emitting structure 300 to the outside.

For the light emitting diode package 10 including the light emitting structure 300, which emits blue light having a peak wavelength of about 440 nm to 460 nm, and the wavelength conversion portion 400 to emit cyan light, the wavelength conversion portion 400 may generally use a silicate phosphor, which is vulnerable to high temperature and high humidity, causing deterioration in reliability of the light emitting diode package 10. However, the light emitting diode package 10 shown in FIG. 13 does not use a silicate phosphor and emits cyan light from the light emitting structure 300, thereby preventing deterioration in reliability due to the silicate phosphor.

Next, FIG. 14 is an exemplary view of a light emitting diode package 10 according to yet another embodiment of the present invention.

Referring to FIG. 14, the light emitting diode package 10 may include a light emitting structure 300, a substrate 100, a reflective portion 900, and a wavelength conversion portion 400.

The light emitting structure 300, the substrate 100, and the reflective portion 900 of the light emitting diode package 10 shown in FIG. 14 are the same or similar configuration to those of the light emitting diode package 10 shown in FIG. 13.

In the light emitting diode package 10 shown in FIG. 14, the wavelength conversion portion 400 is formed on the light emitting structure 300. More specifically, the wavelength conversion portion 400 may be formed to cover an upper surface of the light emitting structure 300 in the cavity 910 of the reflective portion 900.

Although the wavelength conversion portion 400 is formed to cover the upper surface of the light emitting structure 300 in this embodiment, it should be understood that the location of the wavelength conversion portion 400 is not limited thereto. The wavelength conversion portion 400 may be placed on a path along which light emitted from the light emitting structure 300 is emitted. That is, the wavelength conversion portion 400 may be formed at any location so long as the wavelength conversion portion 400 is capable of converting a wavelength of light emitted from the light emitting structure 300.

The wavelength conversion portion 400 may include a light transmitting portion 800 and a first wavelength conversion material 402 dispersed in the light transmitting portion 800. For example, when the light transmitting portion 800 is formed of a silicone resin and the first wavelength conversion material 402 is a phosphor, the wavelength conversion portion 400 may be phosphor-in-silicone (PIS). Alternatively, when the light transmitting portion 800 is glass and the first wavelength conversion material 402 is a phosphor, the wavelength conversion portion 400 may be phosphor-in-glass (PIG).

Light emitted from the light emitting structure 300 may pass through the wavelength conversion portion 400 to be emitted to the outside of the light emitting diode package 10. Here, some fraction of the light emitted from the light emitting structure 300 may be excited by the first wavelength conversion material 402 while passing through the wavelength conversion portion 400. The light excited by the first wavelength conversion material 402 may be converted into light having a different wavelength.

According to this embodiment, the first wavelength conversion material 402 may convert light emitted from the light emitting structure 300 into light having a peak wavelength in the wavelength band of about 500 nm to about 520 nm. Furthermore, the first wavelength conversion material 402 may convert light emitted from the light emitting structure 300 into light having a peak wavelength of about 510 nm. The first wavelength conversion material 402 may be a phosphor. Specifically, the first wavelength conversion material 402 may be YAG or LuAG.

Thus, light excited by the first wavelength conversion material 402 is converted into light having a longer wavelength than the light emitted from the light emitting structure 300. Here, the light excited by the first wavelength conversion material 402 may also be cyan light.

Accordingly, the light emitting diode package 10 according to this embodiment may emit cyan light corresponding to a mixture of light emitted from the light emitting structure 300 with light emitted from the first wavelength conversion material 402. That is, the light emitting diode package 10 may emit cyan light produced by mixing light having a peak wavelength in the wavelength band of about 485 nm to 495 nm with light having a peak wavelength in the wavelength band of about 500 nm to about 520 nm.

Referring to FIG. 14 again, the wavelength conversion portion 400 may have a smaller thickness than the light emitting structure 300. For example, the wavelength conversion portion 400 may have a thickness of 150 μm or less.

The light emitting diode package 10 according to this embodiment includes the light emitting structure 300 that emits cyan light having a wavelength of about 485 nm to about 495 nm, which is a longer wavelength than blue light having a peak wavelength of about 450 nm. Since the light emitting structure 300 emits cyan light, the light emitting diode package 10 according to this embodiment may emit cyan light included in the cyan light range (see FIG. 1) even when the wavelength conversion portion 400 converts a smaller quantity of light than the prior art into cyan light having a different peak wavelength.

Accordingly, the light emitting diode package 10 according to this embodiment may reduce the amount of phosphor, as compared to a typical light emitting diode, whereby the amount of resin or glass containing the phosphor dispersed therein can be reduced. Thus, in the light emitting diode package 10 according to this embodiment, the wavelength conversion portion 400 may have a reduced thickness. In addition, the thickness of the wavelength conversion portion may be smaller than that of the light emitting structure 300. Thus, the overall thickness of the light emitting diode package 10 may also be reduced. In addition, since the thickness of the wavelength conversion portion 400 is thin, the quantity of light lost while light emitted from the light emitting structure 300 passes through the wavelength conversion portion 400 can be reduced. Thus, the light emitting diode package 10 according to this embodiment can improve light output through reduction in thickness of the wavelength conversion portion 400.

Next, FIG. 15 is an exemplary view of a light emitting diode package 10 according to yet another embodiment of the present invention.

Referring to FIG. 15, the light emitting diode package 10 may include a light emitting structure 300, a substrate 100, a reflective portion 900, and a wavelength conversion portion 400.

The light emitting structure 300, the substrate 100, and the reflective portion 900 of the light emitting diode package 300 may have the same or similar configuration as those of the light emitting diode package 10 shown in FIG. 13.

The wavelength conversion portion 400 shown in FIG. 15 may include a light transmitting portion 800 and a second wavelength conversion material 404 dispersed in the light transmitting portion 800. For example, when the light transmitting portion 800 is formed of a silicone resin and the second wavelength conversion material 404 is a phosphor, the wavelength conversion portion 400 may be phosphor-in-silicone (PIS). Alternatively, when the light transmitting portion 800 is glass and the second wavelength conversion material 404 is a phosphor, the wavelength conversion portion 400 may be phosphor-in-glass (PIG).

Some fraction of light emitted from the light emitting structure 300 may be excited and converted into light having a different wavelength while passing through the wavelength conversion portion 400. The second wavelength conversion material 404 may convert light emitted from the light emitting structure 300 into light having a peak wavelength in the wavelength band of about 525 nm to about 545 nm. Further, the second wavelength conversion material 404 may convert light emitted from the light emitting structure 300 into light having a peak wavelength of about 535 nm. Further, the second wavelength conversion material 404 may be a phosphor. Specifically, the second wavelength conversion material 404 may be a YAG or LuAG.

Accordingly, light excited by the second wavelength conversion material 404 is converted into light having a longer wavelength than light emitted from the light emitting structure 300. For example, the light excited by the second wavelength conversion material 404 is cyan light that has a longer wavelength than cyan light emitted from the light emitting structure 300.

Accordingly, the light emitting diode package 10 according to this embodiment may emit cyan light corresponding to a mixture of light emitted from the light emitting structure 300 with light emitted from the second wavelength conversion material 404.

Like the light emitting diode package 10 shown in FIG. 14, the light emitting diode package 10 shown in FIG. 15 can improve light output through reduction in thickness of the wavelength conversion portion 400.

In addition, the light emitting diode packages 10 according to the embodiments shown in FIG. 14 and FIG. 15 may include YAG phosphors or LuAG phosphors rather than silicate phosphors. Therefore, the light emitting diode packages 10 according to the embodiments can avoid reduction in reliability caused by the silicate phosphors.

Since the silicate phosphors are vulnerable to high temperature and cannot be subjected to high-temperature sintering, the silicate phosphors cannot be dispersed in a glass material that requires a sintering process. However, since the wavelength conversion material included in the light emitting diode packages 10 according to the embodiments shown in FIG. 14 and FIG. 15 is YAG or LuAG that can be applied to a high temperature sintering process, the wavelength conversion portion 400 may be formed to allow the wavelength conversion material to be dispersed in a base formed of a glass material. As such, the wavelength conversion portion 400 in which the base is a glass material can be prevented from being degraded by high temperature and moisture, thereby improving reliability of the light emitting diode packages 10.

Next, FIG. 16 is a diagram illustrating color coordinates of light emitting diode packages 10 according to embodiments of the present invention.

Referring to FIG. 16, a first color coordinate group GR1, a second color coordinate group GR2, and a third color coordinate group GR3 are shown. The first color coordinate group GR1 is the color coordinates of light emitted from the light emitting diode packages 100 according to the embodiment shown in FIG. 13. The second color coordinate group GR21 is the color coordinates of light emitted from the light emitting diode packages 10 according to the embodiment shown in FIG. 14. Further, the third color coordinate group GR3 is the color coordinates of light emitted from the light emitting diode packages 10 according to the embodiment shown in FIG. 15.

Referring to FIG. 16, all of the first color coordinate group GR1, the second color coordinate group GR2, and the third color coordinate group GR3 are included in the cyan light range RG shown in FIG. 1.

FIG. 17 is an emission spectrum of the light emitting diode packages 10 according to the embodiments of the present invention. Referring to FIG. 17, a first spectrum ST1 is an emission spectrum of the light emitting diode package 10 according to the embodiment shown in FIG. 13, a second spectrum ST2 is an emission spectrum of the light emitting diode package 10 according to the embodiment shown in see FIG. 14, and a third spectrum ST3 is an emission spectrum of the light emitting diode package 10 according to the embodiment shown in see FIG. 15. In addition, a fourth spectrum ST4 is a light emission spectrum of a typical light emitting diode package. Here, the typical light emitting diode package includes a light emitting structure emitting blue light and a wavelength conversion portion, and emits cyan light.

The fourth spectrum ST4 has high intensity in the wavelength band of about 440 nm to about 560 nm. That is, it can be seen that the typical light emitting diode package emits light that is an even mixture of indigo light, blue light, and green light.

The first spectrum ST1, the second spectrum ST2, and the third spectrum ST3 have high intensity in the wavelength band of about 470 nm to about 530 nm. That is, it can be seen that most of light emitted from the light emitting diode packages 10 according to the embodiments of the present invention is in the wavelength band of about 470 nm to about 530 nm.

As such, the light emitting diode packages 10 according to the embodiments have a much narrower full width at half maximum (FWHM) than the typical light emitting diode packages. In addition, the light emitting diode packages 10 according to the embodiments emit light, most of which is in the cyan wavelength range.

That is, since light emitted from the typical light emitting diode package has high ratios of green light and blue light, it is difficult to realize clear cyan light.

The light emitting diode packages 10 according to the embodiments emit cyan light that is clearly distinguishable from green light and blue light. That is, the light emitting diode packages 10 according to the embodiments may emit clear cyan light that is distinguishable from other colors of light.

It can be seen from FIG. 16 and FIG. 17 that light emitted from the light emitting diode packages 10 according to the embodiments is clear cyan light distinguishable from green and blue light of adjacent wavelengths.

Next, FIG. 18 is an emission spectrum of a light emitting diode package according to an embodiment of the present invention. More specifically, a light emission spectrum shown in FIG. 18 is the first spectrum ST1 which is the light emission spectrum of the light emitting diode package 10 according to the embodiment shown in FIG. 13.

Referring to FIG. 18, the first spectrum ST1 may be bilaterally asymmetrical with respect to a peak wavelength. Here, a long wavelength region IL may have a larger area than a short wavelength region Is with reference to the peak wavelength. As such, light having color coordinates (x, y) within the rectangular range in which four color coordinates (0.04, 0.32), (0.012, 0.494), (0.2, 0.4) and (0.2, 0.32) are sequentially connected to one another can be realized by combining the long wavelength region IL having a large area with the short wavelength region Is having a small area. That is, the first spectrum ST1 shown in FIG. 18 may be included in the cyan light range RG shown in FIG. 1 by the long wavelength region IL having a large area and the short wavelength region Is having a small area with reference to a peak wavelength of about 490 nm.

Although the features of the first spectrum ST1 of the light emitting diode package 10 according to the embodiment shown in FIG. 13 have been described with reference to FIG. 18, it should be understood that the present invention is not limited thereto. That is, the features of the spectrum described with reference to FIG. 18 may be equally exhibited in the emission spectra of the light emitting diode packages 10 described above.

In addition, the light emitting diode packages 10 according to the embodiments including the wavelength conversion portion may convert light emitted from the light emitting structure into light having a long wavelength through the wavelength conversion material. Thus, in the light emitting diode packages 10 according to the embodiments, the long wavelength region IL may have a larger area than the shorter wavelength region Is with reference to a peak wavelength. As such, the light emitting diode packages 10 according to the embodiments may emit light having the color coordinates within the cyan light range RG of FIG. 1 by the wavelength conversion portion 400.

Further, the light emitting diode packages 10 according to the embodiments may emit light having target color coordinates within the cyan light range RG of FIG. 1 through adjustment of the ratio of the long wavelength region IL to the short wavelength region Is by the wavelength conversion portion 400.

For example, in the light spectrum of the light emitting diode packages 10 according to the embodiments, the area of the long wavelength region IL may be may be about 1.01 to 1.6 times the area of the short wavelength region Is with reference to the peak wavelength.

Next, FIG. 19 is an exemplary view of a light emitting diode package 10 according to yet another embodiment of the present invention.

Referring to FIG. 19, the light emitting diode package 10 according to the embodiment may include a light emitting structure 300, a wavelength conversion portion 400, a substrate 120, and a reflective portion 900.

The light emitting structure 300 and the wavelength conversion portion 400 of the light emitting diode package 10 according to this embodiment may have the same or similar configuration to those of the light emitting diode package 10 described above.

The wavelength conversion portion 400 of the light emitting diode package 10 according to the embodiment shown in FIG. 19 may convert light emitted from the light emitting structure 300 into light having a peak wavelength in the wavelength band of about 550 nm to about 570 nm. That is, the wavelength conversion portion 400 may include a wavelength conversion material that converts light into light having a peak wavelength in the wavelength band of about 550 nm to about 570 nm.

Further, in the light emitting diode package 10 according to this embodiment, the light emitting structure 300 may be electrically connected to the substrate 120 by wire bonding. That is, a method for mounting the light emitting diode packages according to this embodiment on the substrate 120 is not limited to a flip-chip bonding method.

Further, the light emitting diode package 10 according to this embodiment may be formed such that the wavelength conversion portion 400 covers not only an upper surface of the light emitting structure 300 but also a side surface thereof. That is, the wavelength conversion portion 400 may be formed to fill the cavity 910 of the reflective portion 900.

Although the light emitting diode package 10 according to this embodiment includes the wavelength conversion portion 400 that converts light emitted from the light emitting structure 300, the light emitting diode package 10 may also include the light transmitting portion 100 instead of the wavelength conversion portion 10.

Next, FIG. 20 is an exemplary view of a light emitting diode package 10 according to yet another embodiment of the present invention.

Referring to FIG. 20, the light emitting diode package 10 according to this embodiment may include a first light emitting structure 300*a*, a second light emitting structure 300*b*, a substrate 100, a reflective portion 900, a first wavelength conversion portion 400*a*, and a second wavelength conversion portion 400*b*.

The light emitting diode package 10 according to the embodiment may include a first light emitting structure 300*a* and a second light emitting portion 300*b* that emit light of different colors.

The first light emitting structure 300*a* and the second light emitting structure 300*b* may be the same as the light emitting structure 300 described in the above embodiments.

In addition, the first wavelength conversion portion 400*a* of the light emitting diode package 10 according to this embodiment may include at least one of the wavelength conversion materials 402, 404 described in the above embodiment. Alternatively, the light emitting diode package 10 according to this embodiment may be formed such that the light transmitting portion 800 covers the first light emitting structure 300*a* instead of the first wavelength conversion portion 400*a*.

Accordingly, the first light emitting structure 300*a* may emit at least one of light having a peak wavelength between about 485 nm and about 495 nm, light having a peak wavelength in the wavelength band of about 500 nm to about 520 nm, light having a peak wavelength in the wavelength band of about 525 nm to about 545 nm, or light having a peak wavelength in the wavelength band of about 550 nm to about 570 nm. Light emitted from the first light emitting structure 300*a* is included in the cyan light range RG of FIG. 1.

The second light emitting structure 300*b* and the second wavelength conversion portion 400*a* of the light emitting diode package 10 may emit light of a different color than the first light emitting structure 300*a* and the second wavelength conversion portion 400*b*. For example, the second light emitting structure 300*b* and the second wavelength conversion portion 400*b* may emit white light. However, it should be understood that this structure is provided by way of example only and the second light emitting structure 300*b* and the second wavelength conversion portion 400*b* may emit any light having a different peak wavelength than the light emitted from the first light emitting structure 300*a* and the first wavelength conversion portion 400*a*.

The configuration of the second light emitting structure 300*b* and the second wavelength conversion portion 400*b* may be varied depending on the type of light to be realized. In addition, the second light emitting structure 300*b* may be covered by the light transmitting portion 800 instead of the second wavelength conversion portion 400*b*.

According to this embodiment, the reflective portion 900 is formed with two cavities. The first light emitting structure 300*a* is disposed in the first cavity 910*a* of the reflective portion 900 and the second light emitting structure 300*b* is disposed in the second cavity 910*b*.

Accordingly, the light emitting diode package 10 according to this embodiment has a structure in which all of side surfaces of the first light emitting structure 300*a* and the second light emitting portion 300*b* are covered by the reflective portion 900 except upper surfaces thereof corresponding to light emission surfaces. That is, the first light emitting structure 300*a* and the second light emitting portion 300*b* may be spaced apart from each other and a space between the first light emitting structure 300*a* and the second light emitting portion 300*b* may be filled with the reflective portion 900.

By such a structure, it is possible to prevent light emitted from the first light emitting structure 300*a* from being subjected to wavelength conversion by the second wavelength conversion portion 400*b* or to prevent light emitted from the second light emitting structure 300*b* from being subjected to wavelength conversion by the first wavelength conversion portion 400*a*. Although the reflective portion 900 according to this embodiment has a different structure than the reflective portions according to the above embodiments, the reflective portion 900 has the same material and role as the reflective portions according to the above embodiments.

In the light emitting diode package 10 according to this embodiment, although the first light emitting structure 300*a* and the second light emitting structure 300*b* are disposed on one substrate 120, the first light emitting structure 300*a* and the second light emitting structure 300*b* may be operated separately. Thus, the first light emitting structure 300*a* and the second light emitting structure 300*b* may operate simultaneously to prevent mixing of first light with second light having a different peak wavelength than the first light.

As such, the light emitting diode package 10 according to this embodiment emits light of two colors, which can be used to output various signals.

Although FIG. 20 shows the light emitting diode package 10 according to this embodiment mounted on the substrate 100 by flip-chip bonding, it should be understood that the light emitting diode package 10 may also be electrically connected to the substrate 100 by wire bonding.

FIG. 21 is an exemplary view of a light emitting diode package 10 according to yet another embodiment of the present invention.

Referring to FIG. 21, the light emitting diode package 10 includes a light emitting structure 300, a wavelength conversion portion 400, a light transmitting portion 800, a substrate 120, and a reflective portion 900.

The light emitting structure 300, the substrate 120, and the reflective portion 900 of the light emitting diode package 10 according to this embodiment may have the same or similar configuration to those of the light emitting diode packages 10 described above.

According to this embodiment, the wavelength conversion portion 400 may be formed on the light emitting structure 300 and the light transmitting portion 800 may be formed on the wavelength conversion portion 400. The wavelength conversion portion 400 according to this embodiment may be the wavelength conversion portion 400 of the light emitting diode package 10 according to the embodiment of FIG. 14 or FIG. 15. In addition, the light transmitting portion 800 may be the light transmitting portion 800 of the light emitting diode package 10 according to the embodiment of FIG. 13.

Alternatively, the wavelength conversion portion 400 according to this embodiment may include at least one of the wavelength conversion materials 402, 404 described in the above embodiments. Thus, the wavelength conversion portion 400 according to this embodiment may convert light from the light emitting structure 300 into at least one of light having a peak wavelength in a wavelength band of about 500 nm to about 520 nm, light having a peak wavelength in a wavelength band of about 525 nm to about 545 nm, or light having a peak wavelength in a wavelength band of about 550 nm to about 570 nm.

According to this embodiment, the light transmitting portion 800 may cover the wavelength conversion portion 400 to protect the wavelength conversion portion 400 from the exterior. That is, the light transmitting portion 800 can prevent external dust or moisture from penetrating into the wavelength conversion portion 400. Thus, the light emitting diode package 10 according to this embodiment can prevent deterioration in physical and optical reliability of the light emitting diode package 10 by preventing deterioration of the wavelength conversion portion 400.

In the light emitting diode package 10 according to this embodiment, the light transmitting portion 800 is formed on the wavelength conversion portion 400. However, the locations of the wavelength conversion portion and the light transmitting portion 800 may be changed. That is, the light transmitting portion 800 may be formed on the light emitting structure 300 and the wavelength conversion portion 400 may be formed on the light transmitting portion 800. Here, since the light transmitting portion 800 is placed between the light emitting structure 300 and the wavelength conversion portion 400, heat from the light emitting structure 300 can be prevented from directly affecting the wavelength conversion portion 400. Thus, this structure can prevent deterioration of the wavelength conversion portion 400 due to heat from the light emitting structure 300, thereby improving reliability of the light emitting diode package 10.

In addition, when the light transmitting portion 800 according to this embodiment is formed of a light transmissive resin, adhesive strength between the light transmitting portion 800 and the reflective portion 900 or between the light transmitting portion 800 and the light emitting structure 300 can be improved. As the light transmissive resin is cured, adhesive strength to the reflective portion 900 or other components in direct contact can be improved. Accordingly, physical reliability of the light emitting diode package 10 can be improved.

Next, FIG. 22 is an exemplary view of a light emitting diode package 10 according to yet another embodiment of the present invention.

Referring to FIG. 22, the light emitting diode package 10 according to this embodiment may include a light emitting structure 300, a first wavelength conversion portion 410, a second wavelength conversion portion 420, a substrate 100, and a reflective portion 900.

The light emitting diode package 10 according to this embodiment is different from the light emitting diode packages described in the above embodiments in that the light emitting diode package 10 has a stack structure of two wavelength conversion portions 410, 420.

According to this embodiment, the first wavelength conversion portion 410 may be formed on the light emitting structure 300 and the second wavelength conversion portion 420 may be formed on the first wavelength conversion portion 410.

The first wavelength conversion portion 410 according to this embodiment may be the wavelength conversion portion 400 of the light emitting diode package 10 according to the embodiment shown in FIG. 14 and the second wavelength conversion portion 420 according to this embodiment may be the wavelength conversion portion 10 of the light emitting diode package 10 according to the embodiment shown in FIG. 15, or vice versa.

Alternatively, each of the first wavelength conversion portion 410 and the second wavelength conversion portion 420 according to this embodiment may include at least one of the wavelength conversion materials 402, 404 described in the above embodiments. Here, the first wavelength conversion portion 410 and the second wavelength conversion portion 420 may include at least one different wavelength conversion material.

Further, the first wavelength conversion portion 410 may be PIS and the second wavelength conversion portion 420 may be PIG. Alternatively, the light transmitting portion 800 of the first wavelength conversion portion 410 may be formed of any of light transmitting resins rather than being limited to a silicone resin.

When the first wavelength conversion portion 410 includes a light transmissive resin, the first wavelength conversion portion 410 can exhibit improved adhesive strength to the light emitting structure 300, the second wavelength conversion portion 420, and the reflective portion 900. In addition, when the second wavelength conversion portion 420 includes glass, the second wavelength conversion portion 420 can prevent external dust or moisture from penetrating into the light emitting diode package 10.

Alternatively, the first wavelength conversion portion 410 may include glass and the second wavelength conversion portion 420 may include a light transmitting resin. Here, since the second wavelength conversion portion 420 includes the light transmitting resin, the second wavelength conversion portion 420 can be adhered to the barrier layer with high adhesive strength. Accordingly, adhesive strength between the second wavelength conversion portion 420 and the reflective portion 900 can prevent the first wavelength conversion portion 410 and the light emitting structure 300 surrounded by the second wavelength conversion portion 420 and the reflective portion 900 from being separated from the light emitting diode package 10. Thus, when the second wavelength conversion portion 420 is disposed on the first wavelength conversion portion 410, reliability of the light emitting diode package 10 can be improved.

Next, FIG. 23 is an exemplary view of a light emitting diode package 10 according to yet another embodiment of the present invention.

Referring to FIG. 23, the light emitting diode package 10 according to this embodiment may include a light emitting structure 300, a wavelength conversion portion 840, a substrate 100, and a reflective portion 900.

The light emitting diode package 10 according to this embodiment is different from the light emitting diode packages of the above embodiments in that the wavelength conversion portion 400 includes two types of wavelength conversion materials.

In this embodiment, the wavelength conversion portion 400 may include a light transmitting portion 800, a first wavelength conversion material 406, and a second wavelength conversion material 408. Here, both the first wavelength conversion material 406 and the second wavelength conversion material 408 may be dispersed in the light transmitting portion 800. In addition, the first wavelength conversion material 406 and the second wavelength conversion material 408 may have different peak wavelengths.

For example, the peak wavelength of the first wavelength conversion material 406 may be in the wavelength band of about 525 nm to about 545 nm. In addition, the peak wavelength of the second wavelength conversion material 408 may be in the wavelength band of about 550 nm to about 570 nm. That is, the first wavelength conversion material 406 may convert light emitted from the light emitting structure 300 into light having a peak wavelength in the wavelength band of about 525 nm to about 545 nm, and the second wavelength conversion material 408 may convert light emitted from the light emitting structure 300 into light having a peak wavelength in the wavelength band of about 560 nm to 570 nm.

In this embodiment, the wavelength conversion portion 400 is described as including two types of wavelength conversion materials by way of example, but is not limited thereto. Alternatively, the wavelength conversion portion 400 according to this embodiment may include at least two types of wavelength conversion materials among the wavelength conversion material having a peak wavelength in the wavelength band of about 500 nm to about 520 nm, the wavelength conversion material having a peak wavelength in the wavelength band of about 525 nm to about 545 nm, or the wavelength conversion material having a peak wavelength in the wavelength band of about 550 nm to about 570 nm, which are descried above.

FIG. 24 is a diagram illustrating color coordinates of light emitting diode packages 10 depending on the content of the wavelength conversion material. That is, FIG. 24 shows experimental data obtained by measuring light from the light emitting diode packages 10 depending on the configuration of the wavelength conversion portion.

The light emitting diode package 10 used in this experiment is the light emitting diode package 10 according to the embodiment shown in FIG. 23. Accordingly, the light emitting structure included in the light emitting diode package 10 emits cyan light, which has a peak wavelength in the wavelength band of 485 nm to 495 nm. Further, the wavelength conversion portion 400 of the light emitting diode package 10 used in this experiment includes a first wavelength conversion material 406 (see FIG. 23) having a peak wavelength in the wavelength band of about 525 nm to about 545 nm and a second wavelength conversion material 408 (see FIG. 23) having a peak wavelength in the wavelength band of about 560 nm to 570 nm.

In this experiment, the color coordinates of light emitted from each of multiple light emitting diode packages were measured depending on the content of each of the wavelength conversion materials 406, 408 constituting the wavelength conversion portion 400 and the ratio between the first and second wavelength conversion materials 406, 408.

A first color coordinate group CG1 was color coordinates of light emitted from a light emitting diode package 10 in which the content of the wavelength conversion material was 20% and the ratio of the first wavelength conversion material 406 to the second wavelength conversion material 408 was 9:1 in the wavelength conversion portion 400.

A second color coordinate group CG2 was color coordinates of light emitted from a light emitting diode package 10 in which the content of the wavelength conversion material 400 was 30% and the ratio of the first wavelength conversion material 406 to the second wavelength conversion material 408 was 9:1 in the wavelength conversion portion 400.

A third color coordinate group CG3 was color coordinates of light emitted from a light emitting diode package 10 in which the content of the wavelength conversion material was 20% and the ratio of the first wavelength conversion material 406 to the second wavelength conversion material 408 was 7:3 in the wavelength conversion portion 400.

A fourth color coordinate group CG4 was color coordinates of light emitted from a light emitting diode package 10 in which the content of the wavelength conversion material was 30% and the ratio of the first wavelength conversion material 406 to the second wavelength conversion material 408 was 7:3 in the wavelength conversion portion 400.

Table 1 shows average color coordinates and luminous flux of each of the first to fourth color coordinate groups CG1, CG2, CG3, CG4.

TABLE 1

| | CIEx | CIEy | Luminous flux (lm) |
|---|---|---|---|
| First color coordinate group | 0.135 | 0.383 | 26 |
| Second color coordinate group | 0.17 | 0.409 | 27.4 |
| Third color coordinate group | 0.149 | 0.399 | 26.5 |
| Fourth color coordinate group | 0.189 | 0.426 | 28.3 |

Referring to Table 1, it can be seen that the luminous fluxes of the first to fourth color coordinate groups CG1, CG2, CG3, CG4 are similar to each other. However, it can be seen that the average color coordinates of the fourth color coordinate group CG4 are placed outside the cyan light range RG.

In addition, referring to FIG. 24, the first and third color coordinate groups CG1, CG3 are placed within the cyan light range RG. However, most color coordinates in the second color coordinate group CG2 are placed outside the cyan light range RG. Further, the fourth color coordinate group CG4 is also placed outside the cyan range RG.

That is, the light emitting diode packages 10 corresponding to the first color coordinate group CG1 and the third color coordinate group CG3 emit light within the cyan light range RG, while the light emitting diode packages 10 corresponding to the second color coordinate group CG2 and the fourth color coordinate group CG3 do not emit light included in the cyan light range RG.

From this experiment, it can be seen that the light emitting diode packages of the embodiments emit light within the cyan light range RG when the wavelength conversion portion 400 contains less than 30% of the wavelength conversion material. Furthermore, it can be seen that the light emitting diode package 10 emits light within the cyan light range RG when the wavelength conversion portion 400 contains 20% or less of the wavelength conversion material. That is, according to the embodiments, the light emitting diode packages may emit light within the cyan light range RG by including the wavelength conversion portion 400 that contains less than 30% or 20% or less of the wavelength conversion material. Here, the wavelength conversion material in the wavelength conversion portion 400 may be at least one of a wavelength conversion material having a peak wavelength in the wavelength band of about 500 nm to about 520 nm, a wavelength conversion material having a peak wavelength in the wavelength band of about 525 nm to about 545 nm, or a wavelength conversion material having a peak wavelength in the wavelength band of about 550 nm to about 570 nm.

Although each of the light emitting diode packages 10 according to the embodiments shown in FIG. 1A to FIG. 11 has been described as including the wavelength conversion portion 400, it is obvious that the light emitting diode packages may include the light transmitting portion 800 instead of the wavelength conversion portion 400 or may include the light transmitting portion 800 together with the wavelength conversion portion 400. Here, light emitted from the light emitting diode packages 10 according to the embodiments shown in FIG. 1A to FIG. 11 may also have the same or similar light characteristics to the light emitting diode package 10 according to the embodiment shown in FIG. 13 to FIG. 15 and FIG. 19 to FIG. 23.

In addition, all of the light emitting diode packages 10 according to the embodiments of FIG. 13 to FIG. 15 and FIG. 19 to FIG. 23 may include the technical features for improving the heat dissipation characteristics described in the light emitting diode packages 10 according to the embodiments of FIG. 1A to FIG. 11.

The light emitting diode packages 10 according to various embodiments of the invention may constitute a light source module 1 as a light source. Hereinafter, the light emitting diode package 10 will be referred to as the light source 10.

Specifically, the light source module 1 may include a light source 10 and a plate 11 on which the light source 10 is disposed, as shown in FIG. 25.

The plate 11 may be a flat plate and the light source 10 may be disposed on one surface of the plate 11.

The light source 10 may be placed in a central region of the plate 11, without being limited thereto.

When one surface of the plate 11 with the light source 10 disposed thereon is referred to as an upper surface of the plate 11, the area of upper surface of the plate 11 may have a different area than the area of a lower surface of the light source 10 and is preferably larger than the area of the light source 10.

In addition, reflectivity of the upper surface of the plate 11 may be different from reflectivity of an outer surface (housing area) of the light source 10, in particular the outer surface (housing area) other than an upper emission surface of the light source 10. Preferably, the outer surface of the light source 10 has greater reflectivity than the upper surface of the plate 11.

In addition, the plate 11 may be formed with one or more through-holes 11*h*. The through-holes 11*b* are openings formed through the plate 11 and may be formed in various sizes and in various numbers and placed at various locations.

The through-holes 11*h* may be formed around a region in which the light source 10 is disposed, and when a plurality of through-holes 11*h* is provided, the through-holes 11*h* may be formed in different sizes.

The through-holes 11*h* may form airflow channels through which air moves through the plate 11, thereby providing an air cooling effect through the through-holes 11*h*.

Although FIG. 25 illustrates an example in which one light source 10 is disposed on an upper surface of the plate 11, it should be understood that the present invention is not limited thereto and a plurality of light sources 10 may be disposed on one plate 11.

When a plurality of light sources 10 is arranged on one plate 11, the plurality of light sources 10 may be arranged in various patterns. For example, the plurality of light sources 10 may be arranged linearly side by side or in a predetermined pattern.

The plurality of light sources 10 may be spaced apart from each other at a preset interval, may emit light with different peak wavelengths, and may be driven independently of each other. However, it should be understood that the present invention is not limited thereto and a single light source 10 may emit light with different peak wavelengths, as described above.

Next, FIG. 26 is a view of a light source module 1 according to another embodiment of the present invention.

Referring to FIG. 26, the light source module 1 may include two plates 12, 13, unlike FIG. 25.

Specifically, the light source module 1 may include a light source 10, a first plate 12 on which the light source 10 is disposed, and a second plate 13 disposed on the first plate 12.

The first plate 12 may have the light source 10 and the second plate 13 disposed on an upper surface thereof, in which the light source 10 and the second plate 13 may be parallel to the upper surface of the first plate 12 in a first direction (R1 direction in FIG. 26).

Here, a gap may be formed between the light source 10 and the second plate 13 and may be an air path region that forms a passage for air to flow into an empty space.

In addition, the upper surface of the first plate 12 may have a different area than a lower surface of the light source 10. Preferably, the upper surface of the first plate 12 has a larger area than the lower surface of the light source 10.

Further, the upper surface of the first plate 12 may have a different area than an upper surface of the second plate 13. Preferably, the upper surface of the first plate 12 has a larger area than the upper surface of the second plate 13.

The first plate 12 is a base plate on which the light source 10 and the second plate 13 are disposed, and may act as a kind of heat sink.

In addition, the upper surface of the first plate 12 may have different reflectivity than the upper surface of the second plate 13. Preferably, the upper surface of the first plate 12 has greater reflectivity than the upper surface of the second plate 13.

Further, the upper surface of the first plate 12 may have different electrical conductivity than the upper surface of the second plate 13. Preferably, the upper surface of the first plate 12 has greater electrical conductivity than the upper surface of the second plate 13.

The upper surface of the first plate 12 may be formed of a different material than the upper surface of the second plate 13. For example, the upper surface of the first plate 12 may be formed of an aluminum material and the upper surface of the second plate 13 may be formed of an insulating material (e.g., a photo solder resist (PSR) coating layer).

The second plate 13 may be provided with a connector 15 for inputting a power/control signal and a wiring portion therefor.

In addition, electrodes 16*a*, 16*b* may be formed on the upper surface of the second plate 13 for electrical connection with the light source 10.

The light source 10 may be electrically connected to the electrodes 16*a*, 16*b* on the upper surface of the second plate 13 via a connection member 18.

The connection member 18 is a kind of coupler, is formed of an electrically conductive material, and may include the same material as the upper surface of the first plate 11 (e.g., aluminum and the like) to have similar reflectivity to the upper surface of the first plate 11.

The connection member 18 may be provided in plural, in which the plurality of connection members 18 may be linearly arranged and spaced apart parallel to each other. Here, the arrangement direction of the connection members 18 may be a second direction (R2 direction in FIG. 26) perpendicular to the first direction (R1 direction in FIG. 26).

In addition, the connection members 18 may have a length in the first direction (R1 direction) and a width in the second direction (R2 direction) perpendicular to the first direction (R1 direction), in which the first direction length may be greater than the second direction width.

Further, the connection members 18 may have an upwardly convex curved region, in which the uppermost end of the curved region may be placed in the gap between the light source 10 and the second plate 13.

Further, the uppermost end of the curved region may be placed at a higher location than the upper surface of the light source 10 and may be placed at a higher location than the upper surface of the second plate 13.

Further, the second plate 13 may be formed with at least one through-hole 13*h*. The through-hole 13*h* is an opening formed through the second plate 13 and the first plate 12 may also form an open region in the region formed with the through-hole 13*h*.

The through-hole 13*h* may be provided in plural, in which the through-holes 13*h* may have different sizes and may be placed at various locations.

Figure 27:
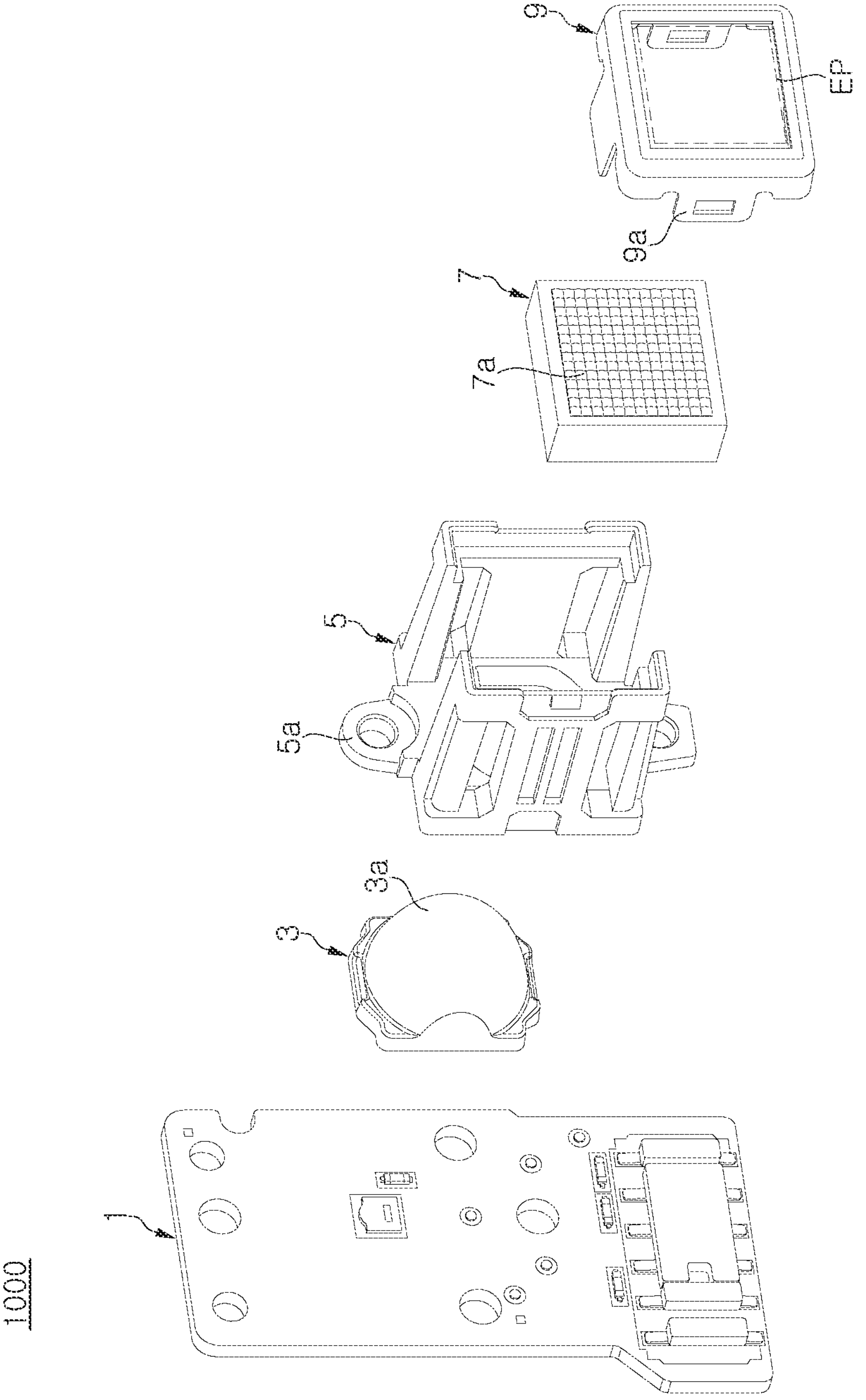
FIG. 27 is an exploded perspective view of a lighting device including a light source module according to an embodiment of the present invention.

Next, FIG. 27 illustrates a lighting device 1000 including a light source module 1 according to an embodiment of the present invention.

Referring to FIG. 27, the lighting device 1000 according to the present invention may include the light source module 1, at least one light guide 3, 7 for guiding a path of light emitted from the light source module 1, and a holder portion 5, 9.

The lighting device 1000 may include at least one light guide 3, 7 for controlling the light path. For example, the lighting device may include a first light guide 3.

The first light guide 3 is a light path control member disposed on an upper surface of the light source module 1 and may be a hemispherical lens member or a light diffusing member having a convex surface 3*a*.

In another example, the lighting device 1000 may include a second light guide 7 having a different shape than the first light guide 3.

The second light guide 7 may be a light path control member with a plurality of light extraction regions 7*a* arranged in matrix form and may be a lens member or a light diffusing member having a rectangular shape in plan view.

The lighting device 1000 may include at least one of the first light guide 3 or the second light guide 7 or may include both the first light guide 3 and the second light guide 7.

The first light guide 3 and the second light guide 7 may be sequentially spaced apart from each other in a light emission direction of the light source module 1 and may be disposed to overlap each other.

A light pattern of light passing through the first light guide 3 may be different from a light pattern of light passing through the second light guide 7, and the first light guide 3 and the second light guide 7, which implement different light patterns, may be sequentially disposed to overlap each other, thereby improving light uniformity.

In addition, the first light guide 3 and the second light guide 7 may have light transmittance for a plurality of peak wavelengths.

The holder portion 5, 9 may be a securing member for the light source module 1 and the light guide 3, 7 and may be realized in various ways.

The holder portion 5, 9 may form an open area EP corresponding to an opening through which the light guide 3, 7 is exposed upwards.

The holder portion 5, 9 may be composed of a single member or a plurality of members.

By way of example, the holder portion 5, 9 may include a first holder 5 that has a coupling region 5*a* fixedly coupled to the light source module 1 and defines an inner space therein, in which the light guide 3, 7 is disposed, and a second holder 9 that forms the open region (EP) and is coupled to an upper side of the first holder 5.

The first holder 5 may be open at upper and lower sides thereof to allow light emitted from the light source module 1 to travel along the light guide 3, 7 and be emitted outside through the open area EP, and may have at least one opening formed in a sidewall thereof to allow internal air circulation.

The second holder 9 includes a holding member 9*a* to be secured to the first holder 5 and may be secured to the first holder 5 to restrict the inner space of the first holder 5 while allowing the light guide 3, 7 to be stably installed.

However, it should be understood that the first holder 5 and the second holder 9 are provide as an example of the holder portion and the present invention is not limited thereto.

On the other hand, the light source module 1 of the lighting device 1000 may be disposed on a separate external frame and a plurality of light sources 10 or a plurality of light emitting structures 300 may be provide to a single light source module 1 such that light with different peak wavelengths can be emitted from one lighting device, as described above.

Figure 28:
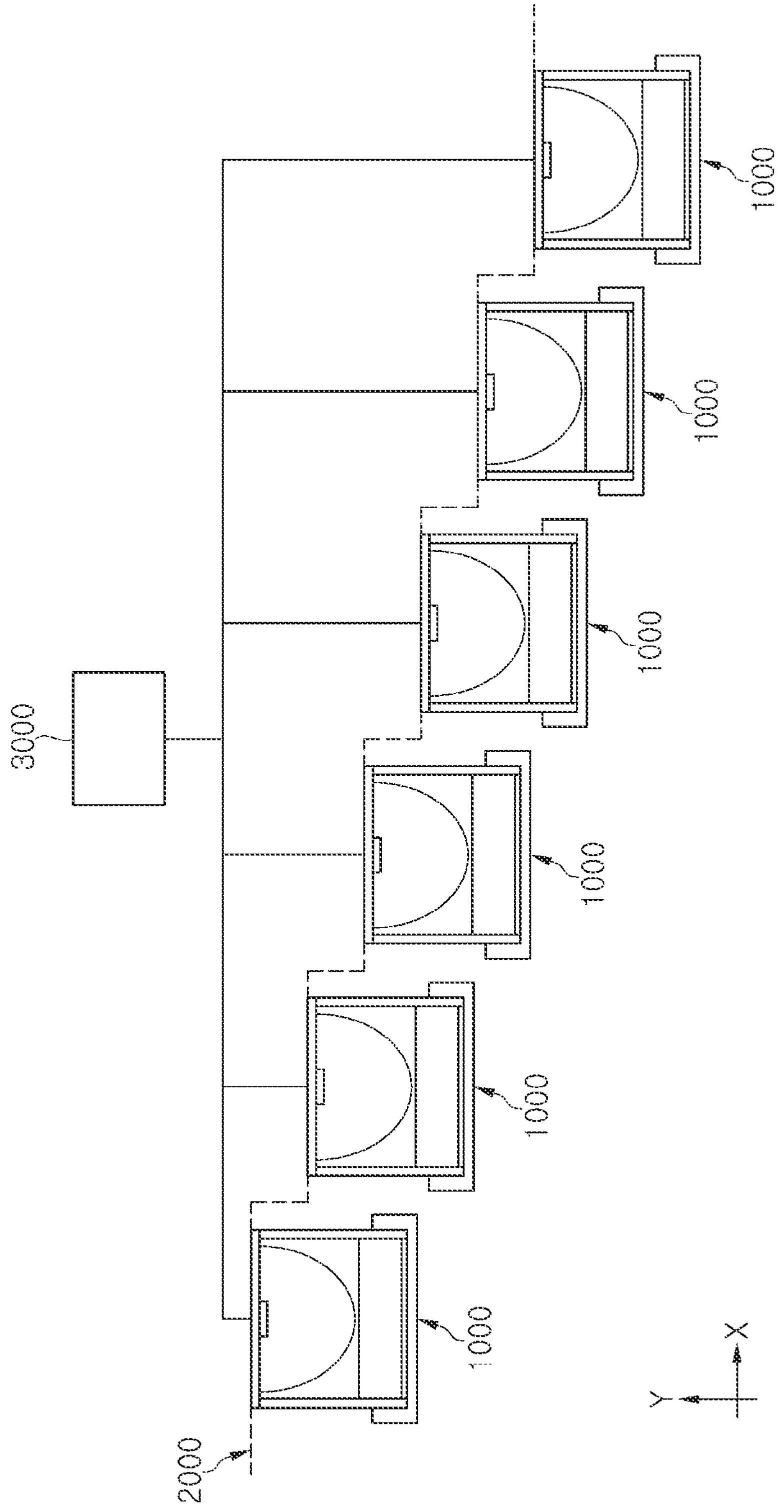
FIG. 28 is an exemplary view of an exemplary lighting system including a plurality of lighting devices according to embodiments of the present invention.

Next, FIG. 28 illustrates an exemplary lighting system including multiple lighting devices 1000 according to an embodiment of the present invention.

The lighting system may include multiple lighting devices 1000 mounted on a frame 2000.

The multiple lighting devices 1000 may be arranged in an M×N matrix on the frame 2000.

For example, at least some of the lighting devices 1000 may be installed to share one light guide 3, 7. In another example, each of the lighting devices 1000 may include a separate light guide 3, 7.

In addition, as shown in FIG. 28, final light emission surfaces of the multiple lighting devices 1000 may be placed on different planes. For example, FIG. 28 illustrates an example in which the multiple lighting devices 1000 are sequentially arranged in one direction (in the X-axis direction with reference to the drawing) to gradually protrude (overhanging arrangement) in a light emission direction (in the Y-axis direction with reference to the drawing). Although FIG. 28 shows an exemplary embodiment in which the multiple lighting devices 1000 are arranged to gradually protrude, it should be understood that the present invention is not limited thereto. In addition to the arrangement shown in FIG. 28, the lighting system according to the present invention may be realized in various other embodiments including wave-like arrangement and the like.

The lighting system may include a controller 3000 that individually controls operation of the multiple lighting devices 1000. The controller may allow the multiple lighting devices 1000 to be turned on in various illumination patterns, such as simultaneous illumination or sequential illumination.

The lighting system may be utilized as a lighting system for various purposes, such as vehicle headlights and the like.

Although some exemplary embodiments have been described herein with reference to the accompanying drawings, it should be understood that various modifications and changes can be made by those skilled in the art or by a person having ordinary knowledge in the art without departing from the spirit and scope of the invention, as defined by the appended claims and equivalents thereto.

Therefore, the scope of the invention should be defined by the appended claims and equivalents thereto instead of being limited to the detailed description of the invention.

LIST OF REFERENCE NUMERALS

100: Substrate
210, 220: First and second upper electrodes
300: Light emitting structure
400: Wavelength conversion portion
510, 520: First and second lower electrodes

The invention claimed is:

1. A light source module comprising a light emitting diode package, the light emitting diode package comprising:

a substrate;

a first upper electrode and a second upper electrode disposed on an upper surface of the substrate;

a light emitter disposed on an upper surface of the first upper electrode and electrically connected to the first upper electrode and the second upper electrode;

a wavelength conversion layer disposed on an upper surface of the light emitter;

a first lower electrode and a second lower electrode disposed on a lower surface of the substrate and electrically connected to the first upper electrode and the second upper electrode, respectively; and a heat dissipation pad disposed on the lower surface of the substrate to be spaced apart from the first lower electrode and the second lower electrode, wherein the wavelength conversion layer has a smaller area than the upper surface of the light emitter in a plan view, wherein an area of the heat dissipation pad vertically overlapping the wavelength conversion layer is larger than a sum of areas of the first lower electrode and the second lower electrode vertically overlapping the wavelength conversion layer.

2. The light source module according to claim 1, wherein the upper surface of the light emitter has a length (g) in a first direction and a length (h) in a second direction perpendicular to the first direction in plan view, and the wavelength conversion layer has a length (a) in the first direction and a length (b) of in the second direction in plan view.

3. The light source module according to claim 2, wherein the length (g) of the light emitter in the first direction is 1 to 1.1 times the length (a) of the wavelength conversion layer in the first direction, and the length (h) of the light emitter in the second direction is greater than the length (b) of the wavelength conversion layer in the second direction.

4. The light source module according to claim 3, wherein an electrode pad for electrical connection to the second upper electrode is disposed in an exposed region of the upper surface of the light emitter, the exposed region not covered by the wavelength conversion layer.

5. The light source module according to claim 1, wherein:

the heat dissipation pad has a length (c) in a first direction and a length (d) in a second direction perpendicular to the first direction in plan view;

the first lower electrode and the second lower electrode have a length (f) in the first direction and a length (e) in the second direction perpendicular to the first direction in plan view, and are disposed side by side to be spaced apart from each other by a preset first distance (D1) in the first direction; and the heat dissipation pad is disposed at one side of the first lower electrode and the second lower electrode to be spaced apart from the first lower electrode and the second lower electrode by a preset second distance (D2) in the second direction.

6. The light source module according to claim 5, wherein the length (a) of the wavelength conversion layer has a value in a range of 0.7 to 0.9 times the length (c) of the heat dissipation pad.

7. The light source module according to claim 5, wherein the length (b) of the wavelength conversion layer has a value in a range of 0.6 to 0.8 times a sum of the length (d) of the heat dissipation pad and the length (e) of the first lower electrode and the second lower electrode.

8. The light source module according to claim 5, wherein a ratio of the length (c) of the heat dissipation pad to the length (e) of the first lower electrode and the second lower electrode is in a range of 1.2 to 1.8.

9. The light source module according to claim 5, wherein a ratio of the length (d) of the heat dissipation pad to the length (c) of the heat dissipation pad is less than a ratio of the length (f) of the first lower electrode and the second lower electrode to the length (e) of the first lower electrode and the second lower electrode.

10. The light source module according to claim 5, wherein a ratio of the length (d) of the heat dissipation pad to the length (f) of the first lower electrode and the second lower electrode is less than 1.2.

11. The light source module according to claim 5, wherein a sum (AR1+AR2) of areas of the first upper electrode and the second upper electrode is in a range of 0.8 to 1.2 times a sum (BR1+BR2+BR3) of areas of the heat dissipation pad, the first lower electrode and the second lower electrode.

12. The light source module according to claim 1, wherein an air path (AP) is formed along side surfaces of the heat dissipation pad, the first lower electrode, and the second lower electrode to allow air to flow along the side surfaces thereof.

13. The light source module according to claim 12, wherein the air path includes a first airflow path formed between the heat dissipation pad and the first lower electrode, a second airflow path formed between the heat dissipation pad and the second lower electrode, and a third airflow path formed between the first lower electrode and the second lower electrode.

14. The light source module according to claim 13, wherein the air path further includes a fourth airflow path formed in a region where the first airflow path, the second airflow path, and the third airflow path meet.

15. The light source module according to claim 14, wherein a central point (AC) of the fourth airflow path and the heat dissipation pad are placed on a same side with reference to a central point (SC) of the lower surface of the substrate.

16. The light source module according to claim 13, wherein the air path further includes an outer airflow path formed along an outer circumference surrounding the heat dissipation pad, the first lower electrode, and the second lower electrode.

17. The light source module according to claim 16, wherein a width of each of the first airflow path and the second airflow path has a value in a range of 90% to 110% of a width of the third airflow path.

18. The light source module according to claim 16, wherein a width (D3) of the outer airflow path is less than or equal to 0.5 times a width of the third airflow path.

19. The light source module according to claim 1, wherein an area of the heat dissipation pad vertically overlapping the substrate is larger than a sum of areas of the first lower electrode and the second lower electrode vertically overlapping the substrate.

* * * * *